United States Patent
Blank

(10) Patent No.: US 9,245,783 B2
(45) Date of Patent: Jan. 26, 2016

(54) VACUUM ROBOT WITH LINEAR TRANSLATION CARRIAGE

(71) Applicant: Novellus Systems, Inc., Fremont, CA (US)

(72) Inventor: Richard M. Blank, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 356 days.

(21) Appl. No.: 13/902,538

(22) Filed: May 24, 2013

(65) Prior Publication Data

US 2014/0348618 A1    Nov. 27, 2014

(51) Int. Cl.
*H01L 21/677* (2006.01)
*B25J 9/04* (2006.01)

(52) U.S. Cl.
CPC ........... *H01L 21/67742* (2013.01); *B25J 9/043* (2013.01)

(58) Field of Classification Search
CPC ............... H01L 21/67742; H01L 21/67748; H01L 21/68707; H01L 21/67766; H01L 21/67196; B23Q 1/5431; B23Q 1/5462; B25J 18/04; B25J 18/02; B25J 18/007; B25J 9/041; B25J 9/042; B25J 9/107; B25J 9/046; B25J 9/104; B25J 9/06; B25J 9/126; B25J 9/043; B25J 19/0029; B25J 19/0041; B25J 19/0033; B24B 47/22; B24B 47/04
See application file for complete search history.

(56) References Cited

U.S. PATENT DOCUMENTS

| | | |
|---|---|---|
| 4,818,169 A | 4/1989 | Schram et al. |
| 5,442,416 A | 8/1995 | Tateyama et al. |
| 5,460,478 A | 10/1995 | Akimoto et al. |
| 5,518,542 A | 5/1996 | Matsukawa et al. |
| 5,826,129 A | 10/1998 | Hasebe et al. |
| 5,919,529 A | 7/1999 | Matsumura |
| 5,984,391 A | 11/1999 | Vanderpot et al. |
| 6,203,582 B1 * | 3/2001 | Berner et al. ............... 29/25.01 |
| 6,234,738 B1 | 5/2001 | Kimata et al. |
| 6,293,713 B1 | 9/2001 | Ueda |
| 6,318,951 B1 * | 11/2001 | Schmidt et al. ............ 414/744.5 |

(Continued)

FOREIGN PATENT DOCUMENTS

| | | |
|---|---|---|
| EP | 0803326 | 10/2002 |
| GB | 2217107 | 10/1989 |
| WO | WO2004036628 | 10/2004 |

OTHER PUBLICATIONS

US Patent Application entitled "High Throughput Robot Architecture for Semiconductor Processing", U.S. Appl. No. 12/627,886, filed Nov. 30, 2009.

(Continued)

*Primary Examiner* — Glenn Myers
(74) *Attorney, Agent, or Firm* — Weaver Austin Villeneuve & Sampson LLP

(57) ABSTRACT

A robot for use in vacuum chambers is disclosed. The robot may be mounted within an oblong transfer chamber and may be translated within the transfer chamber by an umbilical arm operating in conjunction with a linear motion guide and carriage. Motors or drive systems for the robot may be housed in atmospheric conditions, and the transfer chamber may be kept at a vacuum. The robot may include one or more arms configured for wafer handling. The robot may include one or more motors or drive systems and a multi-axial seal to realize independent extension/retraction of each arm and overall simultaneous rotation of the arm assembly.

23 Claims, 20 Drawing Sheets

(56) References Cited

U.S. PATENT DOCUMENTS

| | | |
|---|---|---|
| 6,322,119 B1 | 11/2001 | Schmidt et al. |
| 6,375,746 B1 | 4/2002 | Stevens et al. |
| 6,405,101 B1 | 6/2002 | Johanson et al. |
| 6,431,807 B1 | 8/2002 | Stevens et al. |
| 6,550,484 B1 | 4/2003 | Gopinath et al. |
| 6,669,434 B2 | 12/2003 | Namba et al. |
| 6,722,835 B1 | 4/2004 | Stevens et al. |
| 6,877,946 B2 | 4/2005 | Kinnard et al. |
| 6,934,606 B1 | 8/2005 | Genetti et al. |
| 6,953,382 B1 | 10/2005 | Korovin et al. |
| 7,048,316 B1 | 5/2006 | Blank et al. |
| 7,084,466 B1 | 8/2006 | Lee et al. |
| 7,229,339 B2 | 6/2007 | Stumpf et al. |
| 7,245,987 B2 | 7/2007 | Iijima et al. |
| D562,524 S | 2/2008 | Hiroki et al. |
| 8,033,769 B2 | 10/2011 | Gage et al. |
| 8,092,137 B2 | 1/2012 | Miyasaka |
| 8,137,048 B2 * | 3/2012 | Chidambaram et al. ... 414/744.2 |
| 8,528,438 B2 * | 9/2013 | Chen et al. .................. 74/490.01 |
| 2001/0024611 A1 * | 9/2001 | Woodruff et al. .......... 414/744.5 |
| 2001/0036398 A1 * | 11/2001 | Hofmeister ................ 414/744.1 |
| 2002/0006323 A1 * | 1/2002 | Yoshida et al. ................ 414/217 |
| 2002/0094265 A1 * | 7/2002 | Momoki .................... 414/744.5 |
| 2003/0223853 A1 | 12/2003 | Caveney et al. |
| 2004/0151574 A1 | 8/2004 | Lu |
| 2005/0110292 A1 | 5/2005 | Baumann et al. |
| 2005/0220576 A1 | 10/2005 | Kim et al. |
| 2006/0222480 A1 | 10/2006 | Duhamel et al. |
| 2007/0290150 A1 | 12/2007 | Krupyshev et al. |
| 2008/0138176 A1 | 6/2008 | Kim et al. |
| 2008/0159832 A1 | 7/2008 | Mitsuyoshi |
| 2009/0115137 A1 * | 5/2009 | Shimazaki et al. ........... 277/410 |
| 2010/0022093 A1 * | 1/2010 | Yamaguchi ................. 438/706 |
| 2010/0329827 A1 | 12/2010 | Hoey et al. |
| 2014/0209241 A1 * | 7/2014 | Hiroki et al. .............. 156/345.31 |

OTHER PUBLICATIONS

US Office Action dated Sep. 25, 2012 issued in U.S. Appl. No. 12/627,886.

US Final Office Action dated Mar. 12, 2013 issued in U.S. Appl. No. 12/627,886.

* cited by examiner

VACUUM ROBOT WITH LINEAR TRANSLATION CARRIAGE

BACKGROUND

Different types of tools are used to perform hundreds of processing operations during semiconductor device fabrication. Most of these operations are performed in process chambers at very low pressure, i.e., in a vacuum or partial vacuum. Such process chambers may be arranged about a central hub, and the hub and process chambers may be kept at substantially the same very low pressure. Wafers may be introduced to the process chambers by wafer handling systems that are mechanically coupled to the process chambers. The wafer handling systems transfer wafers from the factory floor to the process chamber. The wafer handling systems may include loadlocks to bring the wafers from atmospheric conditions to very low pressure conditions and back, and robots to transfer the wafers to various positions. Wafer handling systems may utilize robots which operate outside of the vacuum environment, e.g., robots which operate in the ambient factory floor environment, and robots which operate within the very low pressure environment, e.g., vacuum, of the process chambers. Throughput—the number of wafers that is processed in a period of time—is affected by the process time, the number of wafers that are processed at a time, as well as timing of the steps to introduce the wafers into the vacuum process chambers.

Conventional transfer chambers typically feature one or more robotic manipulators that are configured to rotate about a fixed point in the center of a generally circular transfer chamber. A plurality of process chambers may be connected to ports located about the periphery of this circular transfer chamber (the exterior of the transfer chamber may be octagonal or otherwise faceted to provide flat mounting surfaces for mounting the process chambers to the transfer chamber. Due to various factors, e.g., wafer size, process chamber size, and available factory floor space, the number of process chambers (and/or other chambers, e.g., loadlocks) that may be connected to a typical transfer module for a 300 mm wafer process may be limited to, for example, eight chambers—two of which are typically reserved for use by load locks. The number of available mounting locations for process and other chambers at larger wafer sizes, e.g., 450 mm wafers, may, due to common industry floor space constraints and other factors, be reduced to four or six chambers.

In some cases, two conventional transfer chambers may be connected together in an "8" configuration. This may increase the number of available facets for mounting chambers to the transfer chambers, but some of the facets may be blocked from use due to the presence of the additional transfer chamber or because the facets are used to connect the transfer chambers to each other. In such figure-8 configurations, two robot arm assemblies are used, one in each chamber, and the robot arms must pass wafers off to one another in order to move wafers between the transfer chambers.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, an apparatus may be provided that includes a transfer chamber housing that is substantially longer along a first translation axis than along a complementary horizontal axis, a carriage housing configured to translate linearly along the first translation axis and within a linear translation range within the transfer chamber housing, and an umbilical arm having at least one elbow joint. In such an implementation, a first end of the umbilical arm may be rotatably connected with the transfer chamber housing so as to be rotatable about a first rotation axis with respect to the transfer chamber housing, a second end of the umbilical arm opposite the first end may be rotatably connected with the carriage housing so as to be rotatable about a second rotation axis with respect to the carriage housing, the first end of the umbilical arm may be connected with an umbilical arm drive motor configured to rotate the first end of the umbilical arm about the first rotation axis with respect to the transfer chamber housing, and the apparatus may be configured such that rotation of the first end of the umbilical arm about the first rotation axis with respect to the transfer chamber housing causes the second end of the umbilical arm, the carriage housing, and the second rotation axis to translate in a direction parallel to the first translation axis and the second end of the umbilical arm to rotate about the second rotation axis with respect to the carriage housing.

In some such implementations, the transfer chamber housing may have an interior volume that is configured to be sealable and the umbilical arm and the carriage housing may have internal volumes that are sealed off from the interior volume of the transfer chamber housing.

In some such implementations, the transfer chamber housing may include a plurality of ports along at least one side of the transfer chamber housing substantially parallel to the first translation axis, each port at least sized to permit a wafer to be inserted therethrough and each port configured to be hermetically connected to another component. In some further such implementations, the transfer chamber housing may include four ports along each of two sides of the transfer chamber housing substantially parallel to the first translation axis and a ninth port in a side of the transfer chamber housing normal to the first translation axis.

In some implementations, the apparatus may further include a cable assembly routed from the first end of the umbilical arm, through the internal volume of the umbilical arm, and into the internal volume of the carriage housing via the second end of the umbilical arm.

In some implementations of the apparatus, at least one elbow joint of the umbilical arm may include a sealed bearing assembly. In some such implementations, the sealed bearing assembly may be sealed by a ferrofluid seal.

In some implementations, the umbilical arm may include at least one linkage mechanism configured to cause the second end of the umbilical arm to rotate about an elbow joint axis of the elbow joint closest to the second end of the umbilical arm in a first direction when the first end of the umbilical arm is rotated about the first rotation axis in an opposing second direction.

In some other implementations of the apparatus, the umbilical arm may include at least one drive belt mechanism configured to cause the second end of the umbilical arm to rotate about an elbow joint axis of the elbow joint closest to the second end of the umbilical arm in a first direction when the first end of the umbilical arm is rotated about the first rotation axis in an opposing second direction.

In some such implementations, the at least one drive belt mechanism may be configured to cause the second end of the umbilical arm to rotate about the elbow joint axis at twice the rate that the first end of the umbilical arm rotates about the first rotation axis.

In some implementations, the apparatus may further include an umbilical arm drive motor configured to rotate the first end of the umbilical arm about the first rotation axis.

In some implementations of the apparatus, the first rotation axis may be positioned approximately midway along the linear translation range.

In some implementations of the apparatus, the first rotation axis and the second rotation axis may both be parallel to one another and may both generally intersect, and be generally perpendicular to, a reference line that is parallel to the first translation axis.

In some implementations of the apparatus, the apparatus may further include a robot arm assembly having at least one robot arm with at least one end effector configured to support a wafer. The robot arm assembly may be configured to rotate about a third rotational axis substantially perpendicular to the first translation axis.

In some such implementations, the robot arm assembly may have at least two robot arms, each equipped with an end effector configured to support a wafer.

In some other or additional implementations, the apparatus may further include a motor support located within the internal volume of the carriage housing, the motor support configured to translate along a second translation axis parallel to the third rotation axis and within the carriage housing, and a linear drive system, the linear drive system configured to move the motor support along the second translation axis within the internal volume of the carriage housing, wherein the motor support supports the robot arm assembly.

In some such implementations, the apparatus may further include a first drive motor, a second drive motor, and a common drive motor. The first drive motor, the second drive motor, and the common drive motor may all be mounted to, and supported by, the motor support. The at least one robot arm may include a first robot arm that has a first upper arm and a second lower arm, and a second robot arm that has a second upper arm and a second lower arm. The first upper arm and the second upper arm may both be configured to rotate about the third rotation axis, and the first ends of the first upper arm and the second upper arm may be proximate to the third rotation axis. The first drive motor may be configured to rotate the first upper arm about the third rotation axis, the second drive motor may be configured to rotate the second upper arm about the third rotation axis, and the common drive motor may be configured to rotate a common pulley centered on the third rotation axis and connected with belt drive mechanisms within each robot arm. The first end of the first lower arm may be rotatably connected with a second end of the first upper arm opposite the first end of the first upper arm via a first arm elbow having a first arm elbow rotation axis, and a first end of the second lower arm may be rotatably connected with a second end of the second upper arm opposite the first end of the second upper arm via a second arm elbow having a second arm elbow rotation axis. The two robot arms, the first drive motor, the second drive motor, and the common drive motor may be configured such that: activating the first drive motor without activating the common drive motor causes the at least one end effector of the first robot arm to translate along a first substantially radial axis, activating the second drive motor without activating the common drive motor causes the at least one end effector of the second robot arm to translate along a second substantially radial axis, and activating the first drive motor, the second drive motor, and the common drive motor such that the first upper arm, the second upper arm, and the common pulley all have the same rotational rate causes the first robot arm and the second robot arm to rotate about the third rotation axis without linear translation of the end effectors of the first robot arm and the second robot arm.

In some such implementations, the apparatus may further include at least two drive motors configured to drive the robot arm assembly. A first drive motor of the at least two drive motors may be configured to cause the end effector to extend and retract generally along a first radial direction when activated without activating the second drive motor, a second drive motor of the at least two drive motors may be configured to cause the robot arm assembly to rotate about the third rotation axis when activated in tandem with the first drive motor, and the first drive motor and the second drive motor may both be mounted to, and supported by, the motor support.

In some implementations, the umbilical arm may have an upper umbilical arm and a lower umbilical arm, the upper umbilical arm may have a first end corresponding to the first end of the umbilical arm and an opposing second end connected with a first elbow joint of the at least one elbow joint, the lower umbilical arm may have a first end connected with the first elbow joint and an opposing second end corresponding to the second end of the umbilical arm, the lower umbilical arm and the upper umbilical arm may be configured to rotate with respect to one another about an elbow axis of the first elbow joint, and the elbow axis, the first rotation axis, and the second rotation axis may all be parallel to one another.

In some such implementations, a first perpendicular distance between the elbow axis and the first rotation axis may be the same as a second perpendicular distance between the elbow axis and the second rotation axis.

In some implementations, a wafer handling robot apparatus is provided. The apparatus may include a carriage housing configured to translate linearly along a translation axis and within a linear translation range, at least one robot arm mounted to the carriage housing, and an umbilical arm having at least one elbow joint. A first end of the umbilical arm may be configured to rotate about a first rotation axis with respect to the translation axis, the first rotation axis fixed with respect to the linear translation range, and a second end of the umbilical arm opposite the first end may be rotatably connected with the carriage housing so as to be rotatable about a second rotation axis with respect to the carriage housing. The first end of the umbilical arm may be connected with an umbilical arm drive motor configured to rotate the first end of the umbilical arm about the first rotation axis with respect to the translation axis. The wafer handling robot may be configured such that rotation of the first end of the umbilical arm about the first rotation axis with respect to the translation axis by the umbilical arm drive motor causes the second end of the umbilical arm, the carriage housing, and the second rotation axis to translate in a direction parallel to the translation axis and the second end of the umbilical arm to rotate about the second rotation axis with respect to the carriage housing.

In some such implementations, the first rotation axis may be located approximately midway along the linear translation range.

In some implementations, internal volumes of the umbilical arm and the carriage housing up to the first end of the umbilical arm may provide a sealed environment.

In some implementations, an apparatus is provided that may include a transfer chamber housing that is substantially longer along a first translation axis than along a complementary horizontal axis and that has an internal volume, a substrate transfer robot having at least one robot arm configured to handle a substrate and at least one drive motor configured to drive the at least one robot arm, and an umbilical arm configured to translate the substrate transfer robot, including the at least one robot arm and the at least one drive motor configured to drive the at least one robot arm, along a translation axis. The substrate transfer robot may be located within the internal volume of the transfer chamber housing and the apparatus may be configured to maintain a pressure differential between the at least one drive motor and the internal volume of the transfer chamber housing during wafer processing operations. In some such implementations, the pressure differential may be at least 0.5 atm.

These and other aspects of this disclosure are explained more fully below with reference to the accompanying Figures.

DRAWINGS

DETAILED DESCRIPTION

Examples of various implementations are illustrated in the accompanying drawings and described further below. It will be understood that the discussion herein is not intended to limit the claims to the specific implementations described. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Described herein are various apparatuses and system for providing a wafer transfer system that includes an oblong transfer chamber housing that may be sealed and maintained at a vacuum. A carriage housing may be mounted within the transfer chamber housing and may be configured to translate linearly within, and along the long axis of, the transfer chamber housing. An umbilical arm, e.g., a multi-link assembly, may connect the carriage housing with the transfer chamber housing and may be configured such that rotating the link of the umbilical arm that is proximate to the transfer chamber housing with a drive motor causes the umbilical arm to translate the carriage housing along the long axis. The umbilical arm may connect with the transfer chamber housing at a position approximately midway along the translational range of the carriage housing. The carriage housing and the umbilical arm may be equipped with seals to allow the carriage housing and the umbilical arm to be held at atmospheric conditions while the transfer chamber housing is held at vacuum conditions.

Figure 1A:
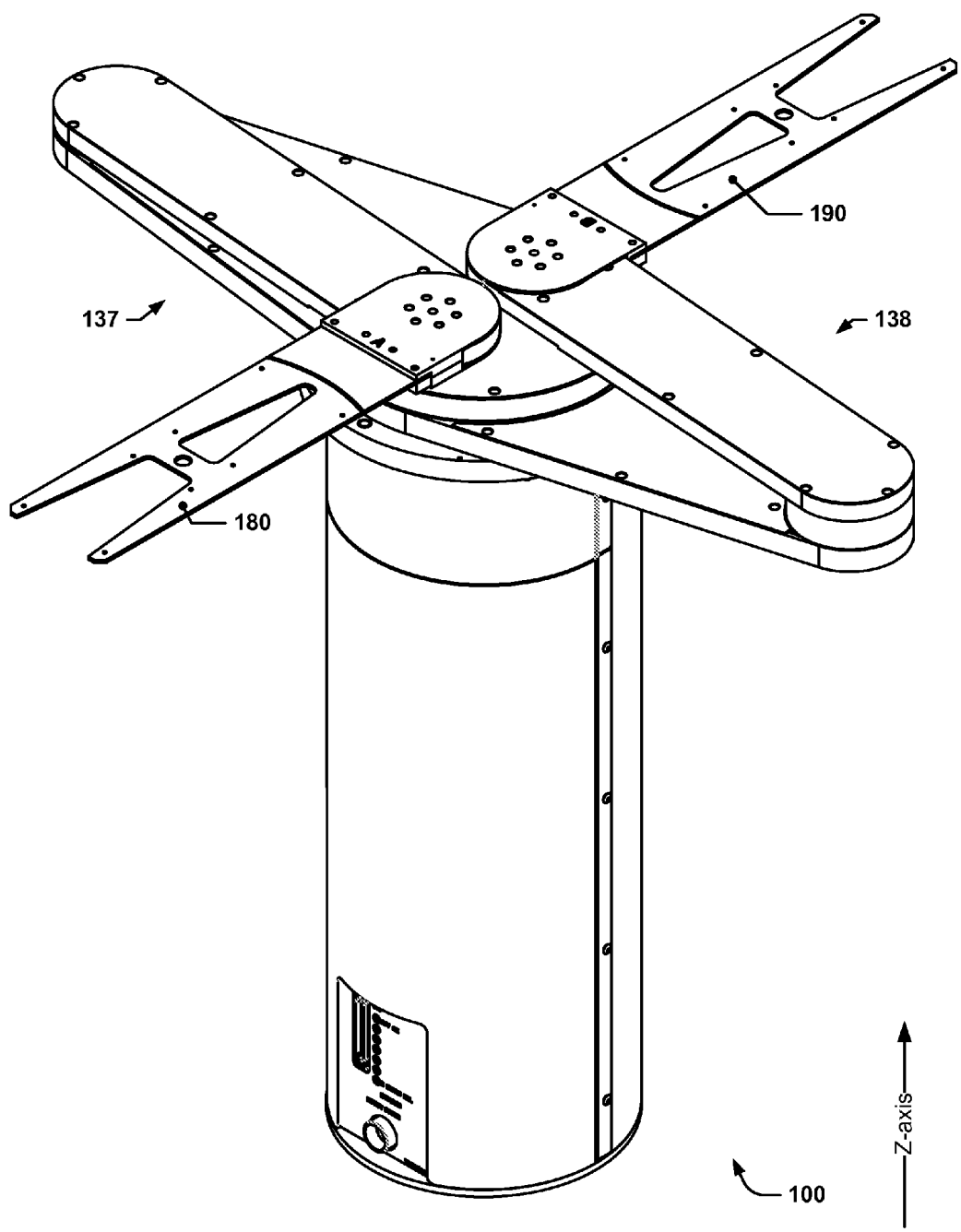
FIG. 1A depicts an isometric view of an example of one implementation of a robot according to the present disclosure.
Figure 1B:
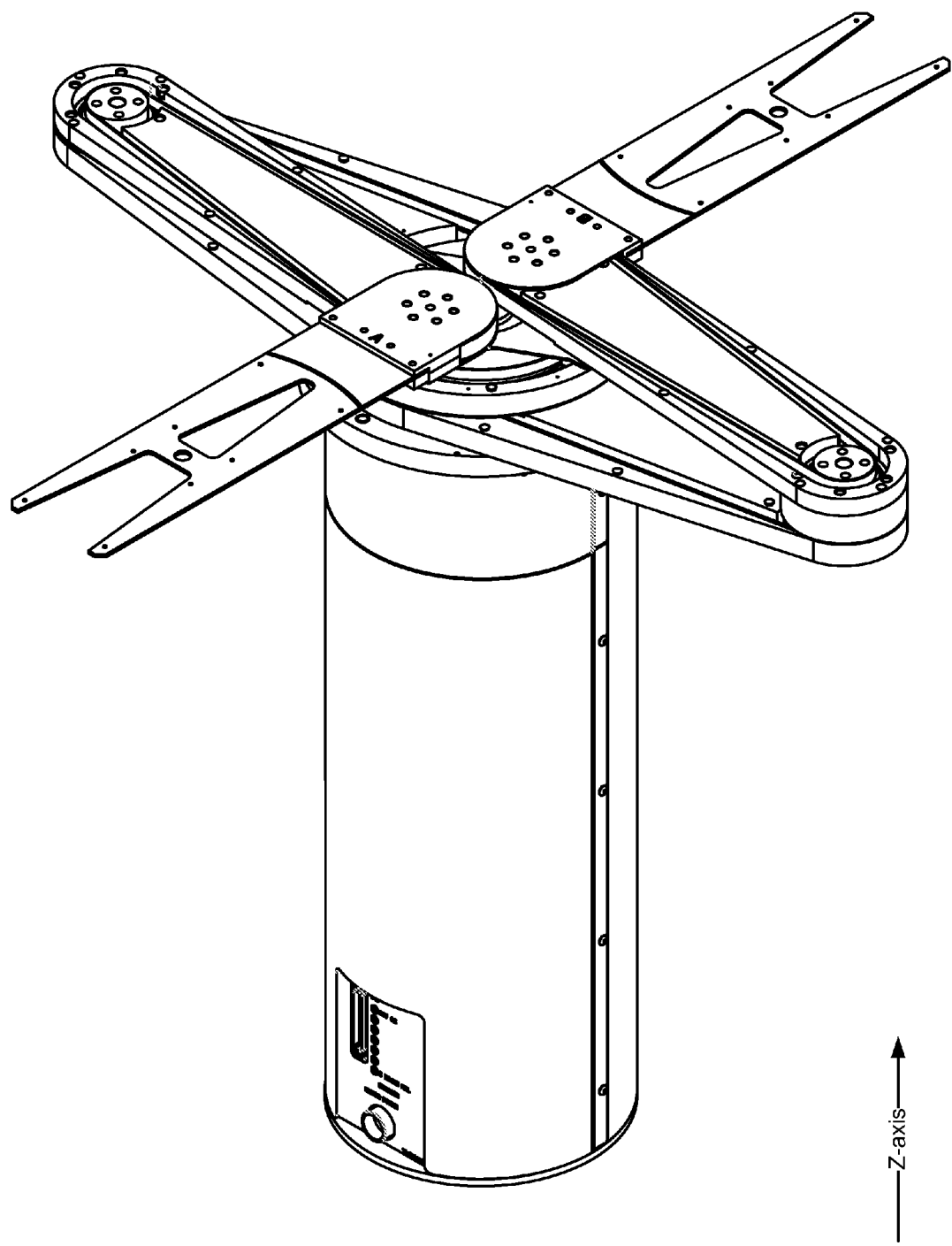
FIG. 1B depicts an isometric view of the robot of FIG. 1A, but with various cover plates removed to show internal mechanisms.

FIG. 1A shows an isometric view of a robot 100 for use in very low pressure environments such as semiconductor fabrication process chamber environments. The robot 100 features an A arm 137 and a B arm 138. The A arm 137 and the B arm 138 may each be configured with end effector A 180 and end effector B 190, respectively, suitable for lifting and transporting semiconductor wafers from station to station. In some implementations, the end effector A 180 and the end effector B 190 may be removably connected to end effector interfaces that are part of the A arm 137 and the B arm 138, respectively. The A arm 137 and the B arm 138 face in opposing directions in robot 100, although other configurations of arms may be used as well. For example, A arm 137 and B arm 138 may face in the same direction and be stacked on top of each other. FIG. 1B shows the robot 100 shown in FIG. 1A, but with various cover panels on portions of the A arm 137 and the B arm 138 removed to allow some of the inner workings of the arms to be seen.

Figure 1C:
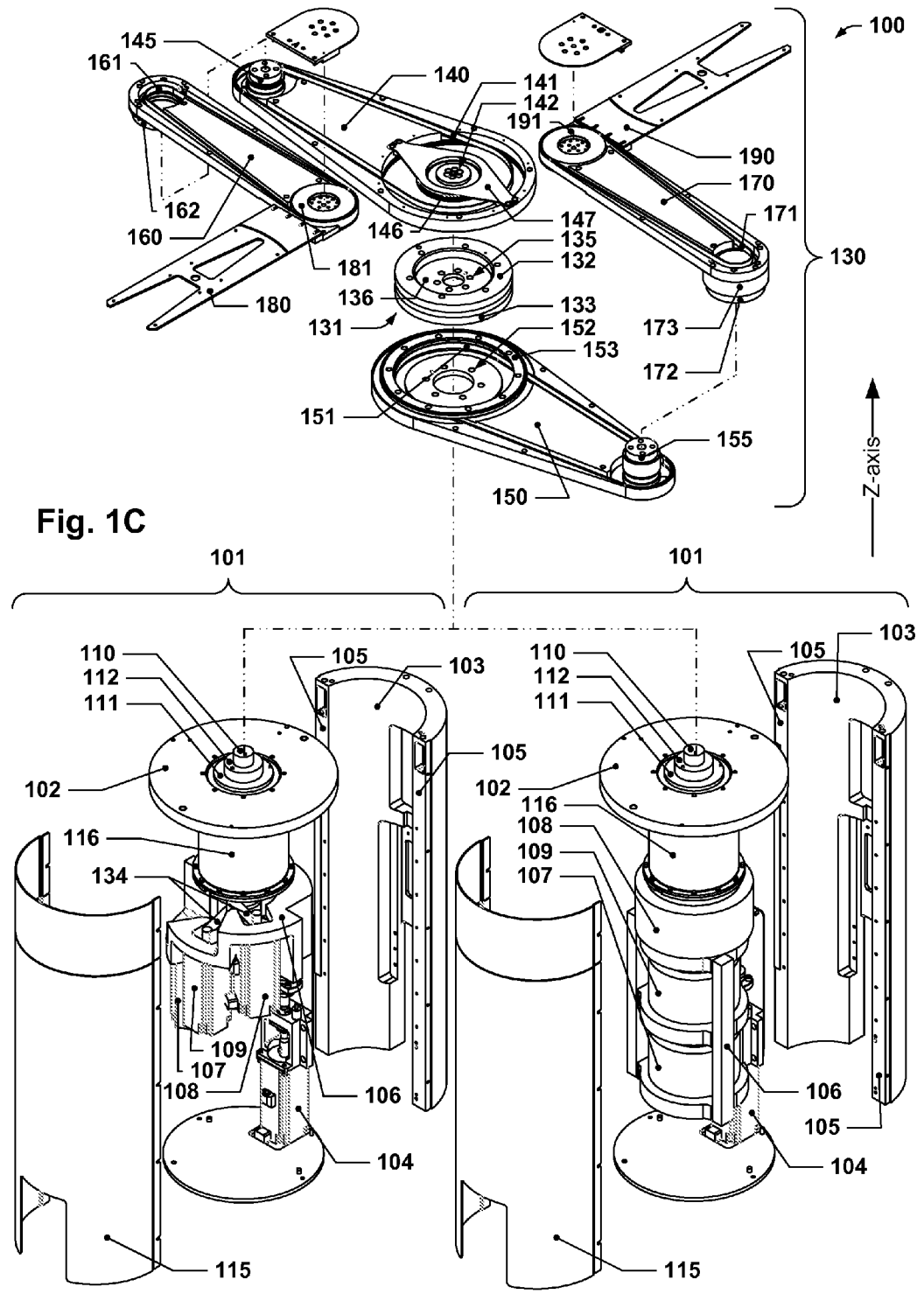
FIG. 1C depicts an isometric exploded view of the robot of FIG. 1B and shows two alternate drive configurations.

FIG. 1C shows an isometric exploded view of the robot 100. Some of the structures shown in FIG. 1C may be shown in simplified form to avoid visual clutter that is not needed to understand the concepts disclosed herein. As with FIG. 1B, various cover panels have been omitted to allow for clearer viewing of other parts. The robot 100 may include a base unit 101 and an arm assembly 130. Two alternate implementations of a base unit 101 are shown, although both may include a base plate 102 that may be used to mount the robot 100 within a semiconductor process chamber, central hub, or tool. A support structure 103 may be rigidly connected with the base plate 102 and may be used to provide support to the arm assembly 130, as well as other components within the base unit 101.

The support structure 103 may, for example, be rigidly connected with rails (not shown) along face 105, that may allow for z-axis, e.g., vertical, movement of a motor support 106. The motor support 106 may include glides or other hardware that may be slidably engaged with the rails and that may prevent the motor support 106 from moving in directions other than along the z-axis. The motor support 106 may be moved in the z-axis direction by a z-axis drive 104. The z-axis drive 104 may be, for example, a linear drive assembly using a lead screw driven by a rotational motor.

The motor support 106 may support an A drive motor 107, a B drive motor 108, and a common drive motor 109. The A drive motor 107, the B drive motor 108, and the common drive motor 109 may be similar motors, or may be different motors. For example, the B drive motor 108 may be a stepper motor that can supply 10 N-m of continuous torque and 30 N-m peak torque. The A drive motor 107 and common drive motor 109 may both, for example, be capable of supplying 5 N-m of continuous torque and 15 N-m of peak torque. In some implementations, motors with torque capabilities of approximately 50% of those discussed in the above example may be used, although such implementations may not be capable of supporting as many different sizes or types of arms as the example motor set may support.

The base unit 101 may also include an A drive shaft 110, a B drive shaft 111, and a common drive shaft 112. The A drive shaft 110 may be rotationally driven by the A drive motor 107. The B drive shaft 111 may be rotationally driven by the B drive motor 108. The common drive shaft 112 may be rotationally driven by the common drive motor 109. The A drive shaft 110, the B drive shaft 111, and the common drive shaft 112 may be coaxially arranged and may all rotate about substantially the same axis. The A drive shaft 110, the B drive shaft 111, and the common drive shaft 112 may all pass through a tri-axial ferro-fluid seal 116, such as those supplied by Ferrotec Corp., and an accompanying bellows coupling. The tri-axial ferro-fluidic seal 116 may allow for three independently driven shafts to be passed through the seal without loss of seal integrity ("tri-axial" does not refer to three orthogonal axes in this case, but to three coaxial axes). This allows the majority of the base unit 101 to be operated in an environment different from the very low pressure environments observed in the hub or the semiconductor process chambers and within which the arm assembly 130 will function. A base cover 115 may be attached to the base unit 101 to prevent damage to the internal components of the base unit 101. While a ferro-fluid seal is used in this implementation, other types of seals may be used in place of, or in addition to, a ferro-fluid seal, such as magnetic couplings or friction seals.

As noted above, two alternative base unit arrangements are shown in FIG. 1C. The right-hand base unit 101 depicts a drive system where the A drive motor 107, the B drive motor 108, the common drive motor 109, the A drive shaft 110, the B drive shaft 111, and the common drive shaft 112 are all coaxial with each other. In such an arrangement, the drive shafts may each be directly coupled to their respective drive motors.

The left-hand base unit 101 depicts a drive system where the A drive motor 107, the B drive motor 108, and the common drive motor 109 are not coaxial with each other, the A drive shaft 110, the B drive shaft 111, or the common drive shaft. In such an arrangement, the drive motors may be coupled to their respective drive shafts via belts, such as belts 134.

The arm assembly 130 may include an A arm 137 and a B arm 138. The A arm 137 and the B arm 138 may operate in a similar manner and utilize many common components, although the two arms may differ slightly in construction to allow for operating clearances and particular arm assembly configurations.

The A arm 137 may include an upper A arm 140 and a lower A arm 160 with and an end effector A 180 attached (or attachable) thereto. The B arm 138 may include an upper B arm 150 and a lower B arm 170 with an end effector B 190 attached (or attachable) thereto. The end effector A 180 and the end effector B 190 can be any type of end effectors including paddles, forks, grippers, and the like. In some implementations, the robot 100 may be provided to a customer without end effectors, but with end effector interfaces that can accept one or more types of end effectors, thereby allowing the customer to customize the robot for a particular application or process.

One end of the upper A arm 140 may be rigidly coupled with the A drive shaft 110 such that when the A drive shaft 110 is rotated by the A drive motor 107, the upper A arm 140 rotates with respect to the base unit 101 about the rotational axis of the A drive shaft 110. For example, a plate with an A drive shaft hole pattern 142 may be bolted to the A drive shaft 110 and joined via an upper A arm bellows coupling 146 to a load transfer plate 147 that is bolted to the upper A arm 140 that allows for a substantially rigid rotational coupling between the A drive shaft 110 and the upper A arm 140 while still allowing for minor axial misalignments during assembly. The other end of the upper A arm 140 may be rotationally coupled with one end of the lower A arm 160. The other end of the lower A arm 160 may, in turn, be rotationally coupled with the end effector A 180.

Similarly, one end of the upper B arm 150 may be rigidly coupled with the B drive shaft 111 such that when the B drive shaft 111 is rotated by the B drive motor 108, the upper B arm 150 rotates with respect to the base unit 101 about the rotation axis of the B drive shaft 111. For example, the upper B arm 150 may be bolted to the B drive shaft via B drive shaft hole pattern 152. The other end of the upper B arm 150 may be rotationally coupled with one end of the lower B arm 170. The other end of the lower B arm 170 may, in turn, be rotationally coupled with the end effector B 190.

The upper A arm 140 and the upper B arm 150 may also be rotationally coupled with each other via an upper arm bearing 153. The rotation axis of the upper arm bearing 153 may be substantially coaxial with the rotation axes of the A drive shaft 110 and the B drive shaft 111.

The upper A arm 140 and the upper B arm 150 may both rotate about a common drive pulley assembly 131, that may be housed between a first recess in the upper A arm 140 and a similar first recess in the upper B arm 150. The common drive pulley assembly 131 may rotate about an axis substantially coaxial with the rotation axes of the A drive shaft and the B drive shaft with respect to the upper A arm 140 and the upper B arm 150. The common drive pulley assembly may include a common drive plate 136 with a common drive shaft hole pattern 135. The common drive shaft hole pattern 135 may be configured to allow the common drive plate 136 to be rigidly connected with the common drive shaft 112 such that rotation of the common drive shaft 112 causes the common drive pulley assembly 131 to rotate about the rotation axis of the common drive shaft 112.

The common drive pulley assembly 131 may also include a common drive pulley A 132 and a common drive pulley B 133, which may be rigidly connected with the common drive plate 136.

The lower A arm 160 may include a lower A arm driven pulley 162, that, when the lower A arm 160 is rotatably connected with the upper A arm 140, may protrude into a second recess in the upper A arm 140. The lower A arm driven pulley 162 may be rigidly connected with the lower A arm 160. The diameter of the lower A arm driven pulley 162 may be one half the diameter of the common drive pulley A 132. An upper A arm drive belt 141 may be stretched over both the lower A arm driven pulley 162 and the common drive pulley A 132. The upper A arm drive belt 141 may be made from steel or some other material with a relatively high tensile elasticity, such as 301 high-yield stainless steel. Various belt tensioning systems may be employed to help eliminate rotational slop between the common drive pulley A 132 and the lower A arm driven pulley 162. A pair of channels connecting the first recess and the second recess of the upper A arm 140 may allow the upper A arm drive belt 141 to span between the common drive pulley A 132 and the lower A arm driven pulley 162.

When the upper A arm 140 is rotated through an angle X with respect to the common drive pulley assembly 131 and, consequently, the common drive pulley A 132, this causes the upper A arm drive belt to circulate within the first recess and the second recess of the upper A arm 140, as well as within the channels connecting those recesses, and also causes the lower A arm driven pulley 162 to be rotated with respect to the upper A arm 140. Due to the 2:1 diameter ratio between the common drive pulley A 132 and the lower A arm driven pulley 162 in this example, the lower A arm driven pulley 162, as well as the lower A arm 160 rigidly connected with the lower A arm driven pulley 162, may be rotated through an angle of 2X and in the opposite direction of the rotation of the upper A arm 140 by the movement of the upper A arm drive belt 141.

The end effector A 180, as mentioned above, may be rotationally coupled with the end of the lower A arm 160 opposite the end of the lower A arm 160 featuring the lower A arm driven pulley 162. The end effector A 180 may include an end effector A driven pulley 181 that is rigidly connected with the end effector A 180, i.e., rotation of the end effector A driven pulley 181 with respect to the lower A arm 160 causes the end effector A 180 to rotate with respect to the lower A arm 160 as well. A lower A arm drive belt 161 may be stretched over the end effector A driven pulley 181 and an upper A arm drive pulley 145. The upper A arm drive pulley 145 may be rigidly connected with the upper A arm 140, and may be approximately one half the diameter of the end effector A driven pulley 181. The lower A arm drive belt 161 may be made from material similar to that used for the upper A arm drive belt 141.

When the lower A arm 160 is rotated through an angle Y with respect to the upper A arm 140, which consequently causes the upper A arm drive pulley 145 to rotate with respect to the lower A arm 160, this causes the lower A arm drive belt 161 to circulate within the lower A arm 160 and also causes the end effector A driven pulley 181 to be rotated with respect to the lower A arm 160 through, in this example, an angle of ½Y and in the opposite direction of the rotation of the lower A arm 160.

Because the end effector A 180, the lower A arm 160, and the upper A arm 140 may all be kinematically linked with each other by the various pulleys and belts described above, rotating the upper A arm 140 through an angle X with respect to common drive pulley A 132 may cause the lower A arm 160 to rotate through an angle of −2x with respect to the upper A arm 140, and to cause the end effector A 180 to rotate through an angle of X with respect to lower A arm 160. For example, if the upper A arm 140 is rotated by 30° CW, the lower A arm 160 would rotate 60° CCW with respect to the upper A arm 140, and the end effector A 180 would rotate 30° CW with respect to the lower A arm 160, which results in a net rotation of 0° of the end effector A 180 in absolute terms. This may result in the end effector A 180 translating in a linear direction with respect to the axis of rotation of the upper A arm 140 but with no rotation of the end effector A 180 about the axis of rotation of the upper A arm 140.

The B arm 138 is constructed in a manner very similar to the manner in which the A arm 137 is constructed, although with some differences. The lower B arm 170 may include a lower B arm driven pulley 172, that, when the lower B arm 170 is rotatably connected with the upper B arm 150, may protrude into a second recess in the upper B arm 150. The lower B arm driven pulley 172 may be rigidly connected with the lower B arm 170 via a spacer 173, which may offset the lower B arm 170 from the upper B arm 150 sufficiently far enough to cause the lower B arm 170 and the lower A arm 160 to be co-planar. The diameter of the lower B arm driven pulley 172 may be one half the diameter of the common drive pulley B 133. An upper B arm drive belt 151 may be stretched over both the lower B arm driven pulley 172 and the common drive pulley B 133. The upper B arm drive belt 151 may be made from material similar to that used for the upper A arm drive belt 141. A pair of channels connecting the first recess and the second recess of the upper B arm 150 may allow the upper B arm drive belt 151 to span between the common drive pulley B 133 and the lower B arm driven pulley 172.

When the upper B arm 150 is rotated through an angle X with respect to the common drive pulley assembly 131 and, consequently, the common drive pulley B 133, this causes the upper B arm drive belt to circulate within the first recess and the second recess of the upper B arm 150, as well as within the channels connecting those recesses, and also causes the lower B arm driven pulley 172 to be rotated with respect to the upper B arm 150. Due to the 2:1 diameter ratio between the common drive pulley B 133 and the lower B arm driven pulley 172 in this example, the lower B arm driven pulley 172, as well as the lower B arm 170 rigidly connected with the lower B arm driven pulley 172, may be rotated through an angle of 2X and in the opposite direction of the rotation of the upper B arm 150 by the movement of the upper B arm drive belt 151.

The end effector B 190, as mentioned above, may be rotationally coupled with the end of the lower B arm 170 opposite the end of the lower B arm 170 featuring the lower B arm driven pulley 172. The end effector B 190 may include an end effector B driven pulley 191 that is rigidly connected with the end effector B 190, i.e., rotation of the end effector B driven pulley with respect to the lower B arm 170 causes the end effector B 190 to rotate with respect to the lower B arm 170 as well. A lower B arm drive belt 171 may be stretched over the end effector B driven pulley 191 and an upper B arm drive pulley 155. The upper B arm drive pulley 155 may be rigidly connected with the upper B arm 150, and may be approximately one half the diameter of the end effector B driven pulley 191.

When the lower B arm 170 is rotated through an angle Y with respect to the upper B arm 150, which consequently causes the upper B arm drive pulley 155 to rotate with respect to the lower B arm 170, this may cause the lower B arm drive belt 171 to circulate within the lower B arm 170 and may also cause the end effector B driven pulley 191 to be rotated with respect to the lower B arm 170 through, in this example, an angle of ½Y and in the opposite direction of the rotation of the lower B arm 170.

Because the end effector B 190, the lower B arm 170, and the upper B arm 150 may all be kinematically linked with each other by the various pulleys and belts described above, rotating the upper B arm 150 through an angle X with respect to common drive pulley B 133 may cause the lower B arm 170 to rotate through an angle of −2X with respect to the upper B arm 150, and to cause the end effector B 190 to rotate through an angle of X with respect to lower B arm 170. For example, if the upper B arm 150 is rotated by 30° CW, the lower B arm 170 would rotate 60° CCW with respect to the upper B arm 150, and the end effector B 190 would rotate 30° CW with respect to the lower B arm 170, which results in a net rotation of 0° of the end effector B 190 in absolute terms. This may result in the end effector B 190 translating in a linear direction with respect to the axis of rotation of the upper B arm 150 but with no rotation of the end effector B 190 about the axis of rotation of the upper B arm 150.

Figure 1D:
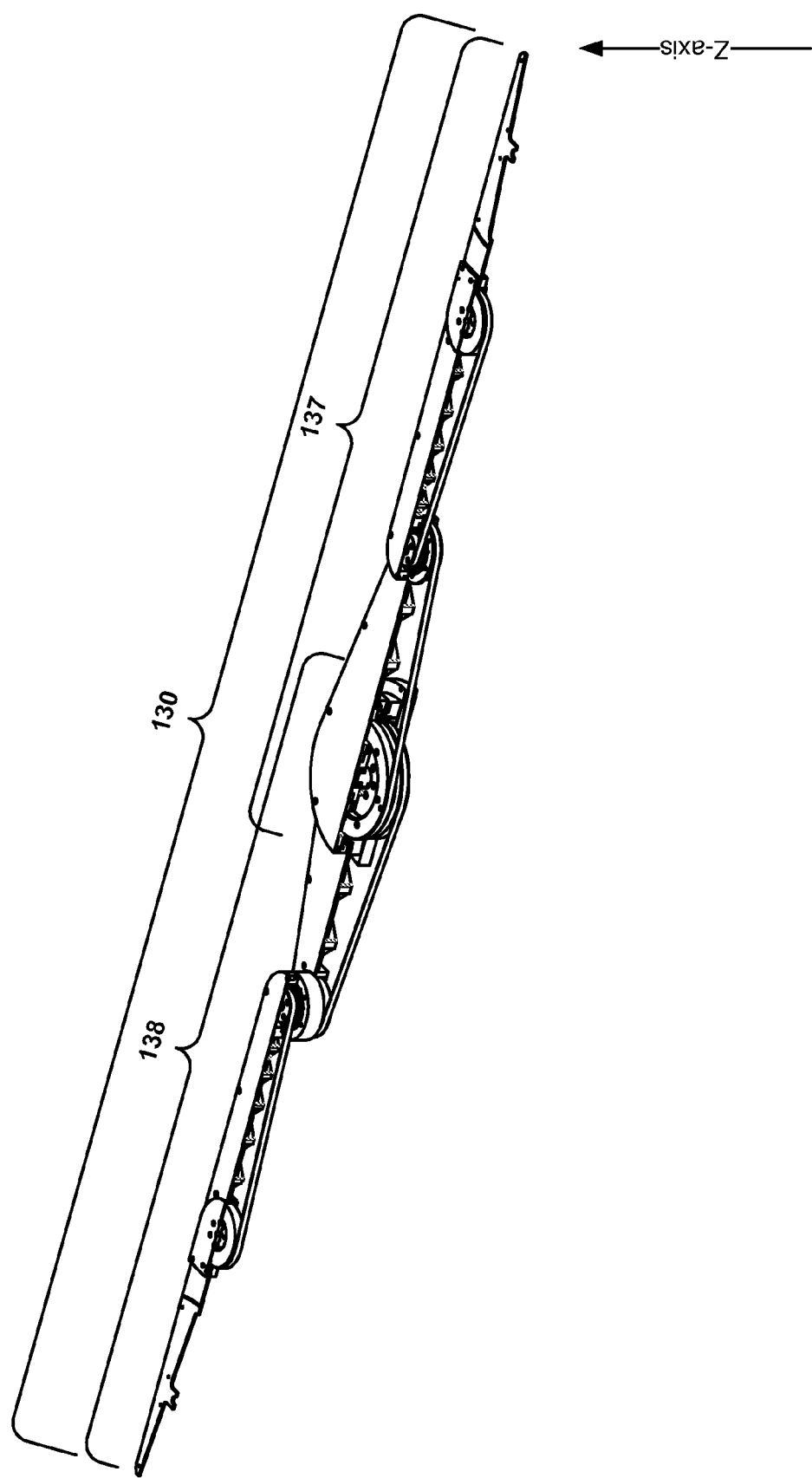
FIG. 1D shows a trimetric view of the arm assembly of FIGS. 1A-1C, but with some components shown in cut-away form and with the arms in a fully-extended position.
Figure 1E:
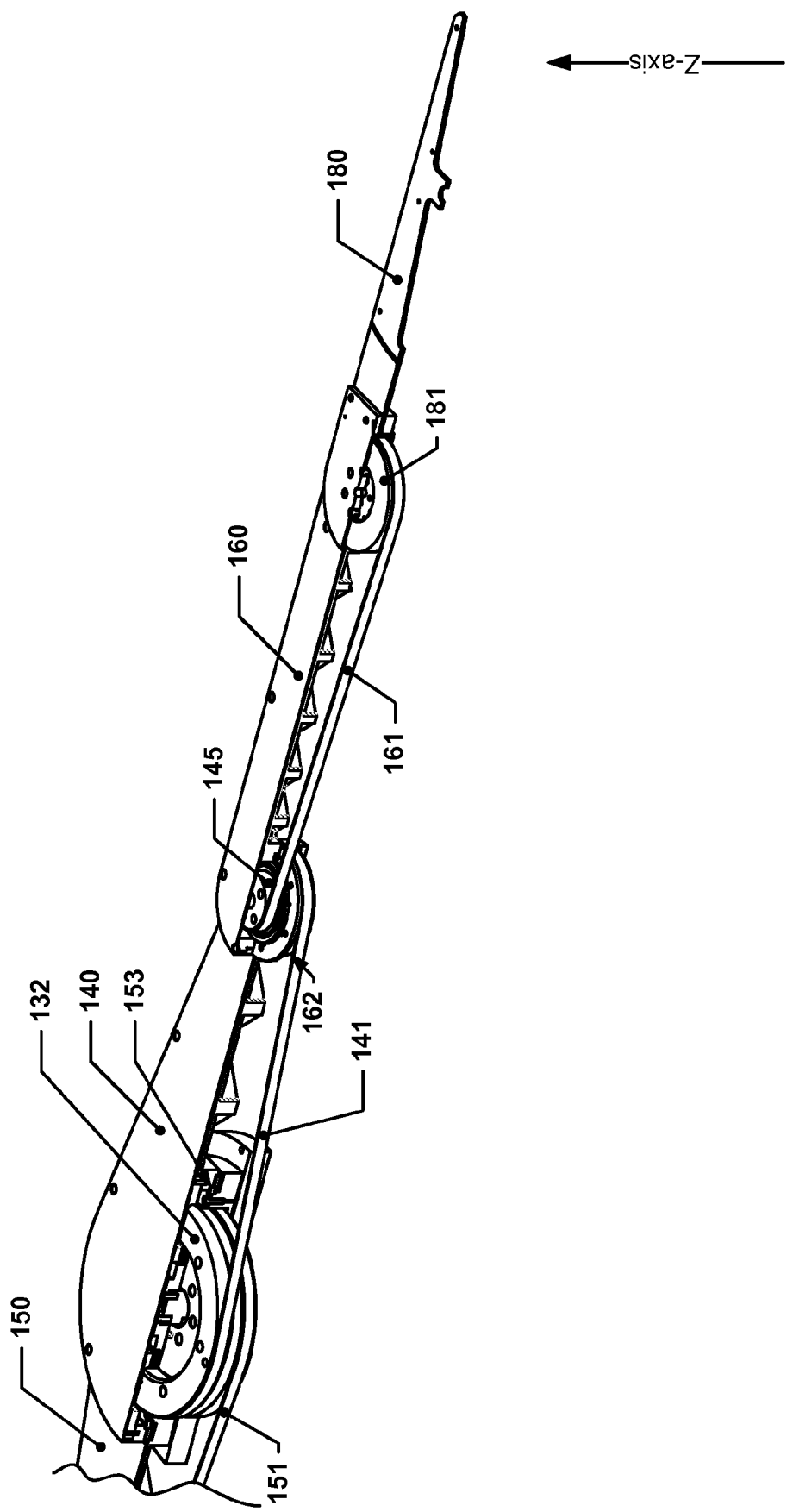
FIG. 1E shows a detail trimetric view of the A arm of the robot of FIG. 1D.
Figure 1F:
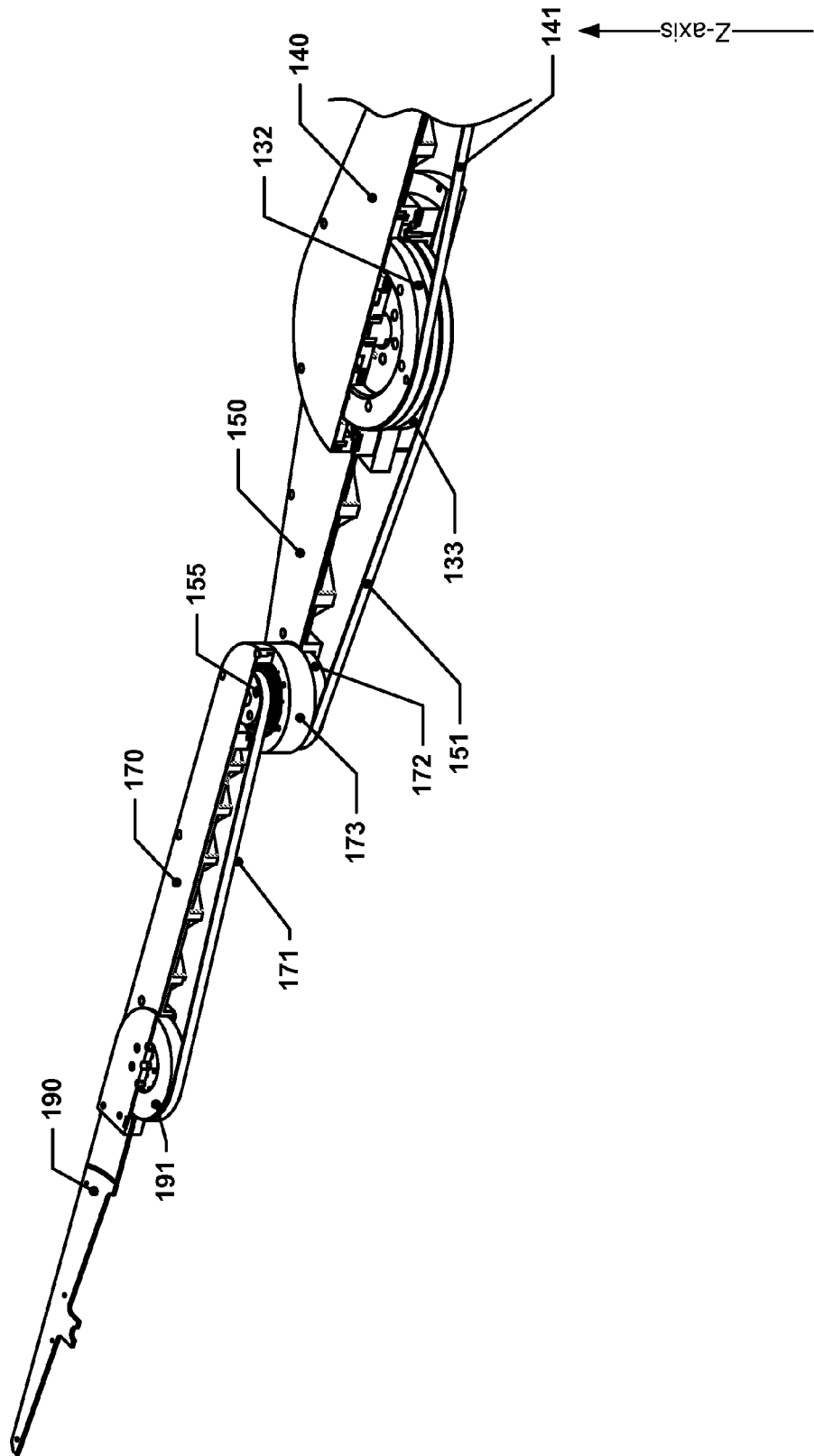
FIG. 1F shows a detail trimetric view of the B arm of the robot of FIG. 1D.

FIGS. 1D through 1F depict trimetric views of a partial cutaway of the robot 100. To allow for easier viewing, the robot 100 is shown with the arm assembly 130 at full extension, although such a configuration of the arm assembly 130 may not be possible in actual operation due to limits on belt travel within the arms or due to motion-limiting hard stops. Upper A arm 140, upper B arm 150, lower A arm 160, lower B arm 170, end effector A 180, and end effector B 190 are all shown with one half of their respective portions cut away to allow for enhanced viewing of the interior components. FIG. 1D shows the entire robot 100, FIG. 1E focuses on A arm 137, and FIG. 1F focuses on B arm 138. Various components discussed above are indicated in FIGS. 1D through 1F.

The various components of the robot 100 shown in FIGS. 1A through 1J may be made from a variety of different materials that may be selected according to various requirements. The A arm 137 and B arm 138 may, for example, be made primarily of aluminum. Various bearing surfaces within robot 100 may, for example, be made from stainless steel. Other materials may be used as needed, although materials may, in general, be selected to be largely inert with respect to process gases.

Figure 1G:
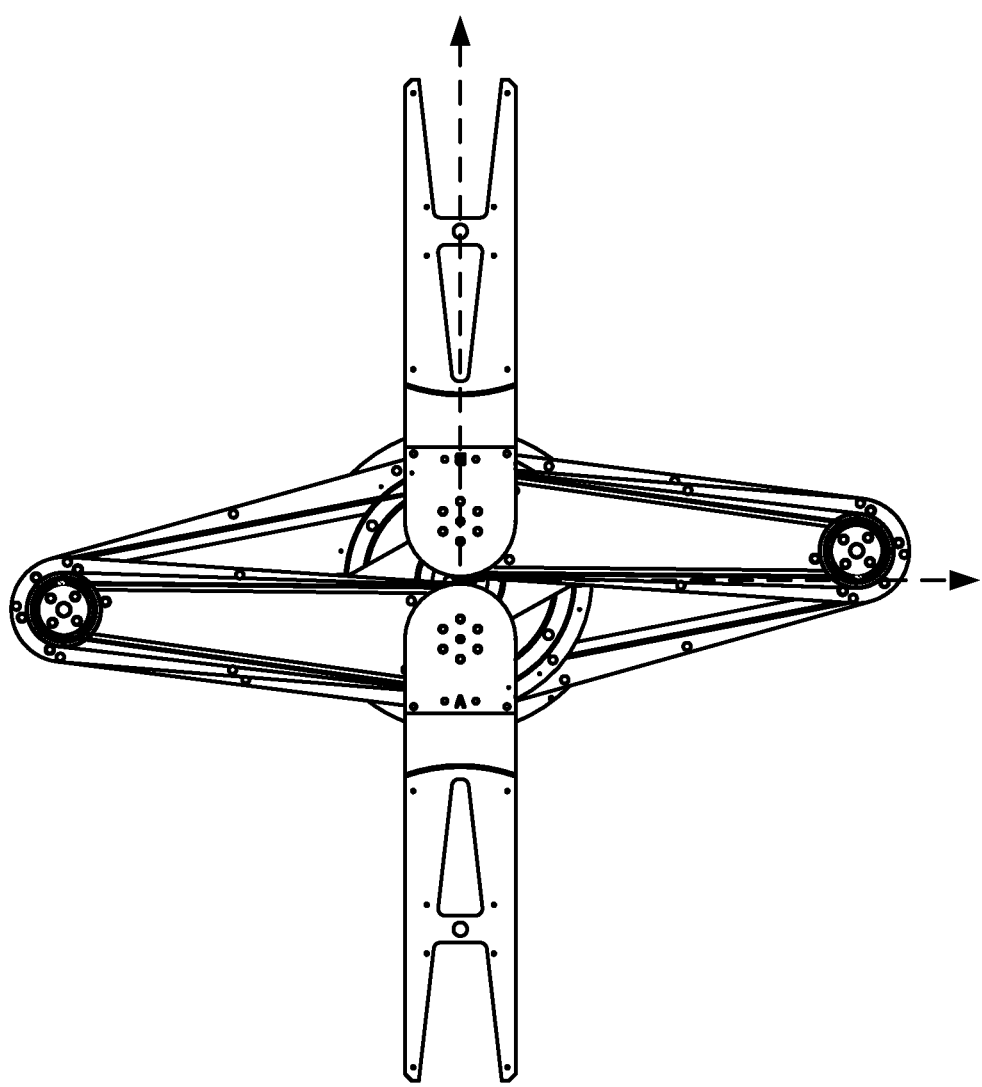
FIG. 1G shows a top view of the robot of FIG. 1A with both arms retracted.
Figure 1H:
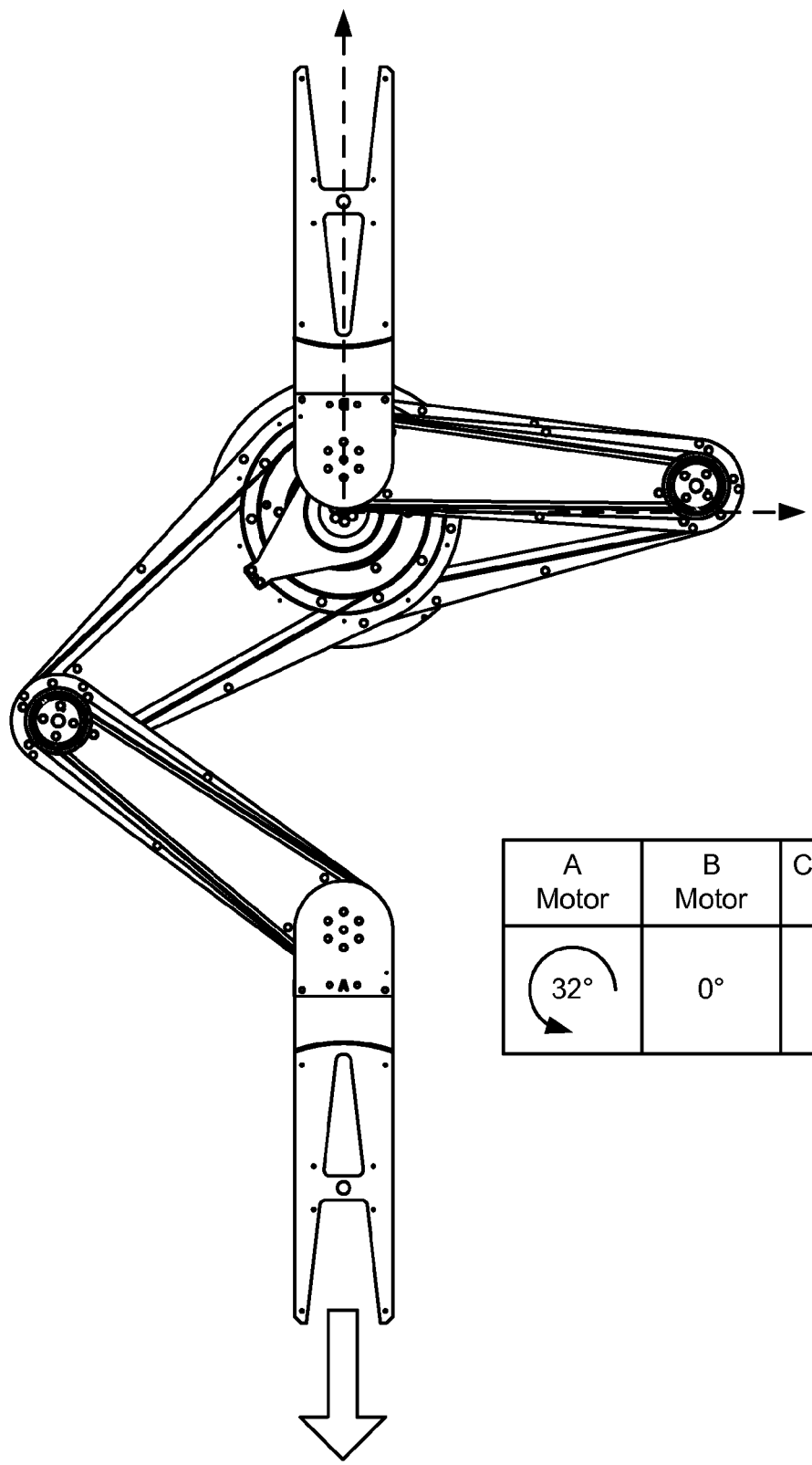
FIG. 1H shows a top view of the robot of FIG. 1G with the A arm extended.

FIG. 1G depicts a top view of the robot 100 in an "at-rest" position. FIG. 1H depicts the robot 100 with the upper A arm 140 rotated approximately 32° from the position the upper A arm is in FIG. 1G, which causes the end effector A 180 to be extended away from the center of the robot 100. The configuration shown in FIG. 1H may be achieved by rotating the A drive motor 107 approximately 32° counter-clockwise from the position the A drive motor 107 is in, and by keeping the B drive motor 108 and the common drive motor 109 stationary, with respect to the positions those drive motors are in FIG. 1G.

Figure 1I:
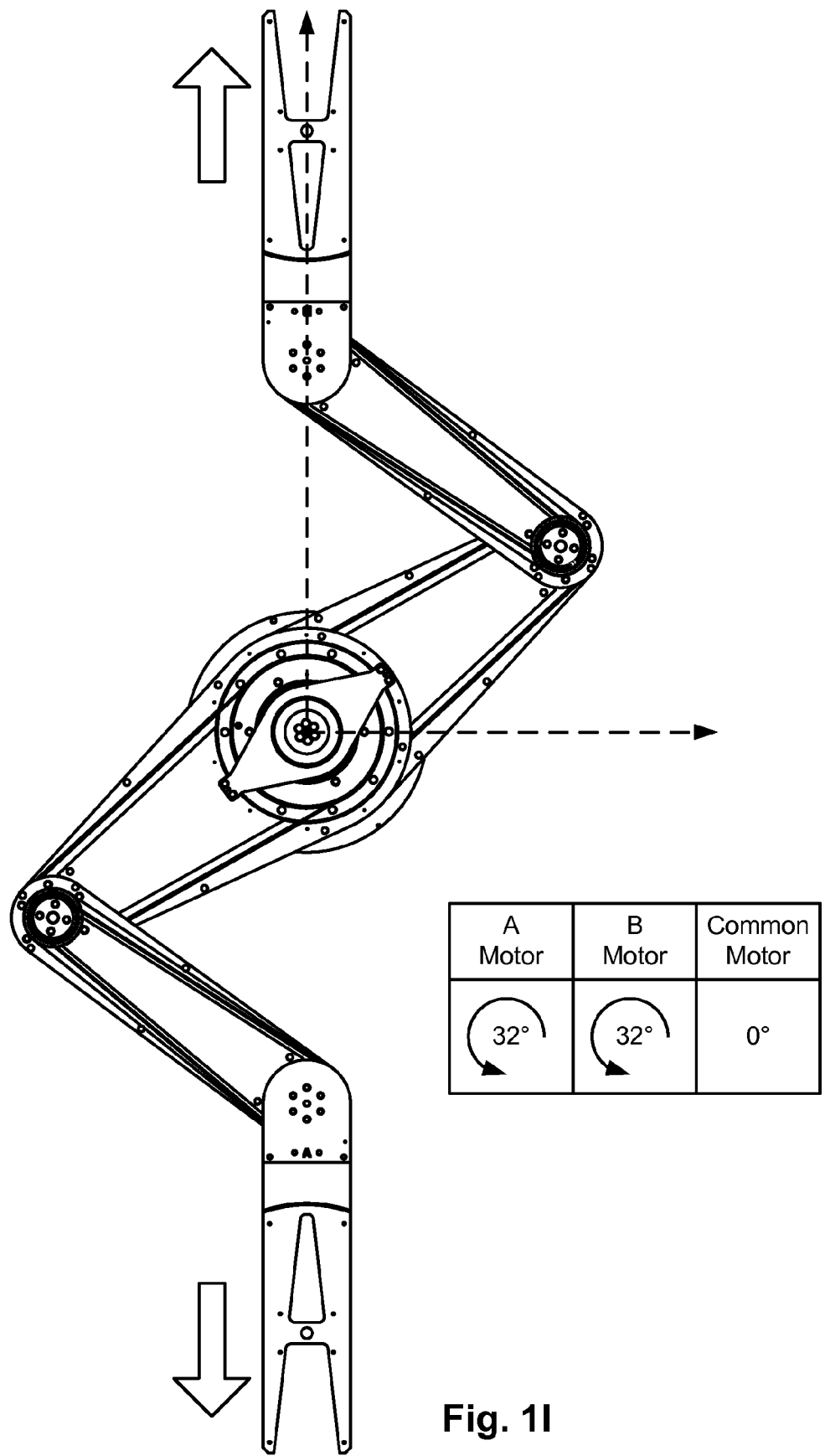
FIG. 1I shows a top view of the robot of FIG. 1G with the A arm and the B arm extended.

FIG. 1I depicts a top view of the robot 100 with both upper A arm 140 and upper B arm 150 rotated approximately 32° counter-clockwise from the position each arm is in FIG. 1G, which causes the end effector A 180 and the end effector B 190 to extend away from the center of the arm assembly 130. While the A drive motor 107 and the B drive motor 108 may both be rotated by 32° with respect to the positions those motors are in FIG. 1G, the common drive motor 109 may remain stationary with respect to the position it is in FIG. 1G.

While the above discussion has focused on rotational movement of the upper arms which causes the end effectors to translate in a direction perpendicular to the axis of rotation of the upper arms, the upper arms may also be rotated to cause the end effectors to rotate about the upper arm rotational axes without translation, i.e., the entire arm assembly 130 may be rotated about the rotational axes of the upper arms without any movement of the arms with respect to each other.

Such rotational movement of the arm assembly may be achieved by rotating the upper A arm 140, the upper B arm 150, and the common drive pulley assembly 131 in the same direction and at the same angular rate. Since the rotational movements of the lower A arm 160 with respect to the upper A arm 140 and the end effector A 180 with respect to the lower A arm 160 are both driven by relative rotational movement of the upper A arm 140 with respect to the common drive pulley A 132, rotating the common drive pulley assembly 131 at the same rotational rate as the upper A arm 140 results in the lower A arm 160 staying fixed with respect to the upper A arm 140 and the end effector A 180 staying fixed with respect to the lower A arm 160 while the entire A arm 137 rotates. Similar behavior may be observed in the B arm 138. Thus, the robot 100 may be used to perform "pick" and "place" operations, in which the end effectors are extended and retracted, in combination with vertical displacement of the arm assembly 130, in order to pick up or place wafers in wafer processing chambers or other locations. The robot 100 may also be rotated to allow the end effectors to be extended into and retracted from different processing chambers.

Figure 1J:
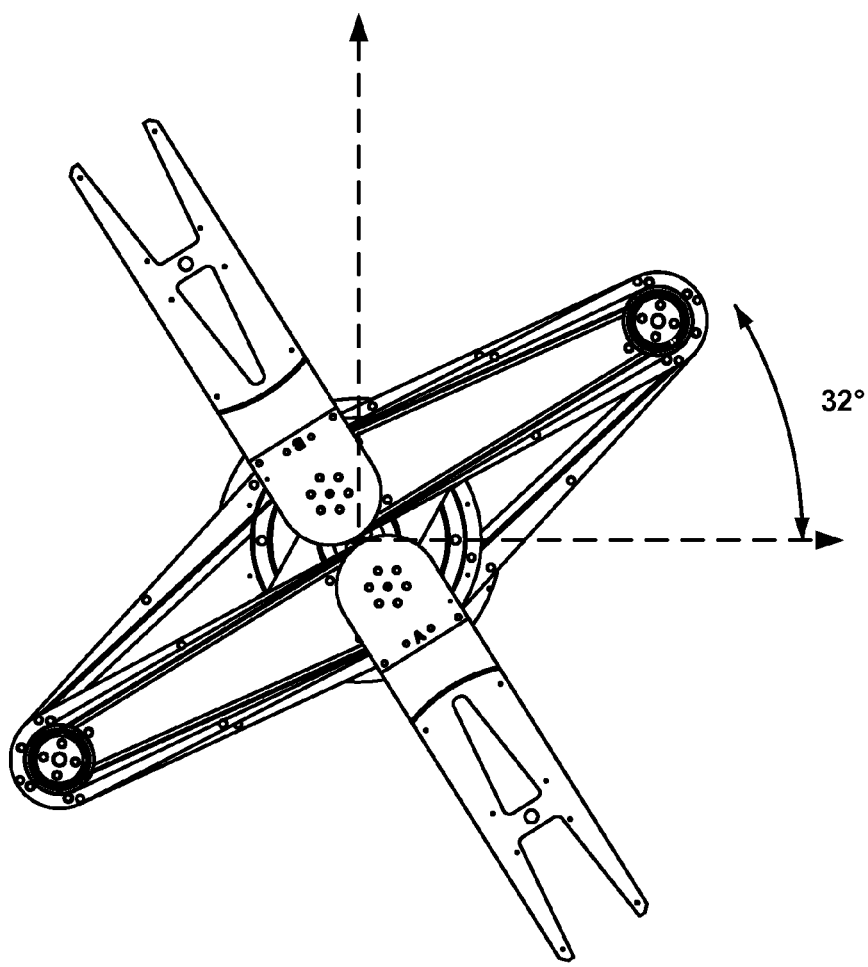
FIG. 1J shows a top view of the robot of FIG. 1G with the A arm and the B arm retracted and the entire arm assembly rotated.

FIG. 1J depicts a top view of the robot 100 showing such rotational movement. In FIG. 1J, the A drive motor 107, the B drive motor 108, and the common drive motor 109 are all rotated by approximately 32° with respect to the positions of those motors in FIG. 1G. This results in the entire arm assembly 130 rotating about the centers of rotation of the upper A arm 140 and the upper B arm 150 without any translation of the end effectors away from these rotational axes.

The A arm 137 and the B arm 138 may each be actuated independently of each other, i.e., the A arm 137 and the B arm 138 are not kinematically linked with each other during end effector linear/radial translation. In a robot such as the robot 100, the end effectors may be paddle or spatula type effectors that lift a wafer from underneath and may rely on friction to hold the wafer in place while the end effector is in motion. Some implementations may utilize other types of end effectors, such as vacuum-assisted friction devices. In end effectors that utilize friction, however, the maximum acceleration with which the end effector may be moved when carrying a wafer may be friction-limited, i.e., accelerating the rate of effector movement beyond a certain limit may cause the wafer that the end effector is carrying to slip because the acceleration is sufficient to overcome the friction force. When movement of an end effector does not cause movement of a wafer, there is no risk of wafer slippage due to the movement of the end effector and the maximum acceleration of the end effector may instead be torque-limited instead of friction-limited. However, in designs where end effectors are kinematically linked, e.g., translation of one end effector causes some translation of the other end effector, the maximum acceleration of an end effector may still be friction-limited even when that end effector is not carrying a wafer if the other end effector is carrying a wafer. At the least, a wafer that shifts during effector movement may not be in the optimum location when placed in the destination process chamber, and valuable process time may be lost correcting for the misplacement. In some cases, slippage may result in the wafer falling off of the effector and may cause damage to, or destruction of, the wafer in addition to lost process time.

Because the A arm 137 and the B arm 138 are not kinematically linked during end effector linear translation, each end effector is only friction limited when actually carrying a wafer during end effector linear translation. This allows a robot such as the robot 100 to operate at higher throughput rates. For example, consider a wafer transfer operation in which the A arm 137 is used to pick up a wafer using a "pick" motion while the B arm 138 is used to hold a different wafer using the end effector B 190. A pick motion may include extending the end effector A 180 away from the base unit 101 of the robot 100 (a linear translation of the end effector A 180 underneath the wafer), a z-axis translation of the arm assembly 130 upwards (lifting the wafer clear of the wafer support), and a retraction of the end effector A 180 (a linear translation of the end effector A to withdraw the wafer from the process chamber). In a robot with kinematically-linked arms, the time for each of these stages is estimated to be 0.9 seconds for extension, 0.7 seconds for z-axis translation upwards, and 1.4 seconds for retraction. By contrast, the estimated time for each stage using a robot such as the robot 100 is 0.6 seconds for extension, 0.7 seconds for z-axis translation upwards, and 1.4 seconds for retraction. As can be seen, the last two stages for either robot have similar times because in the last two stages, both arms of the robot are carrying wafers. However, the first stage is noticeably quicker for the robot 100 since the A arm 137 may be moved at a higher rate of speed since it is not kinematically linked to the wafer-holding B arm 138 during the extension of the end effector A 180.

Similarly, a "place" motion, in which wafers may be placed into a destination chamber, may see a similar speed increase using a robot such as the robot 100. A place motion may include similar stages to those used in a pick motion, but with downwards z-axis movement instead of upwards z-axis movement. In a robot with kinematically-linked arms, the time for each of these stages is estimated to be 1.4 seconds for extension, 0.7 seconds for z-axis translation downwards, and 0.9 seconds for retraction. By contrast, the estimated time for each stage using a robot such as the robot 100 is 1.4 seconds for extension, 0.7 seconds for z-axis translation downwards, and 0.6 seconds for retraction.

In between the pick and place motions, the robot 100 may rotate the arm assembly 130, for example, by 180° in order to transfer a picked wafer from one processing chamber to another processing chamber. While a rotation of greater than 180° may be performed, the same end positioning may often be achieved by rotating a lesser amount in the opposite direction, thus, 180° represents a reasonable maximum rotation angle through which the arm assembly 130 may be rotated in many implementations. The robot 100 and a robot with kinematically-linked arms may both take approximately 2.4 seconds to rotate 180°.

Thus, according to the estimates provided above, a robot with kinematically-linked arms may require 8.4 seconds to perform a single pick, rotation, and place cycle, whereas the robot 100 may only require 7.8 seconds to perform the same actions. Each wafer must at least be picked from a loadlock and placed into a chamber, and then picked from the chamber and placed into a loadlock, a minimum of two such complete pick-and-place cycles must be performed for each wafer—if additional process chambers are involved, the number of pick-and-place cycles per wafer may increase beyond this. This represents approximately an 8% improvement in cycle time for the robot 100 over a robot with kinematically-linked arms.

Figures 2A, 2B:
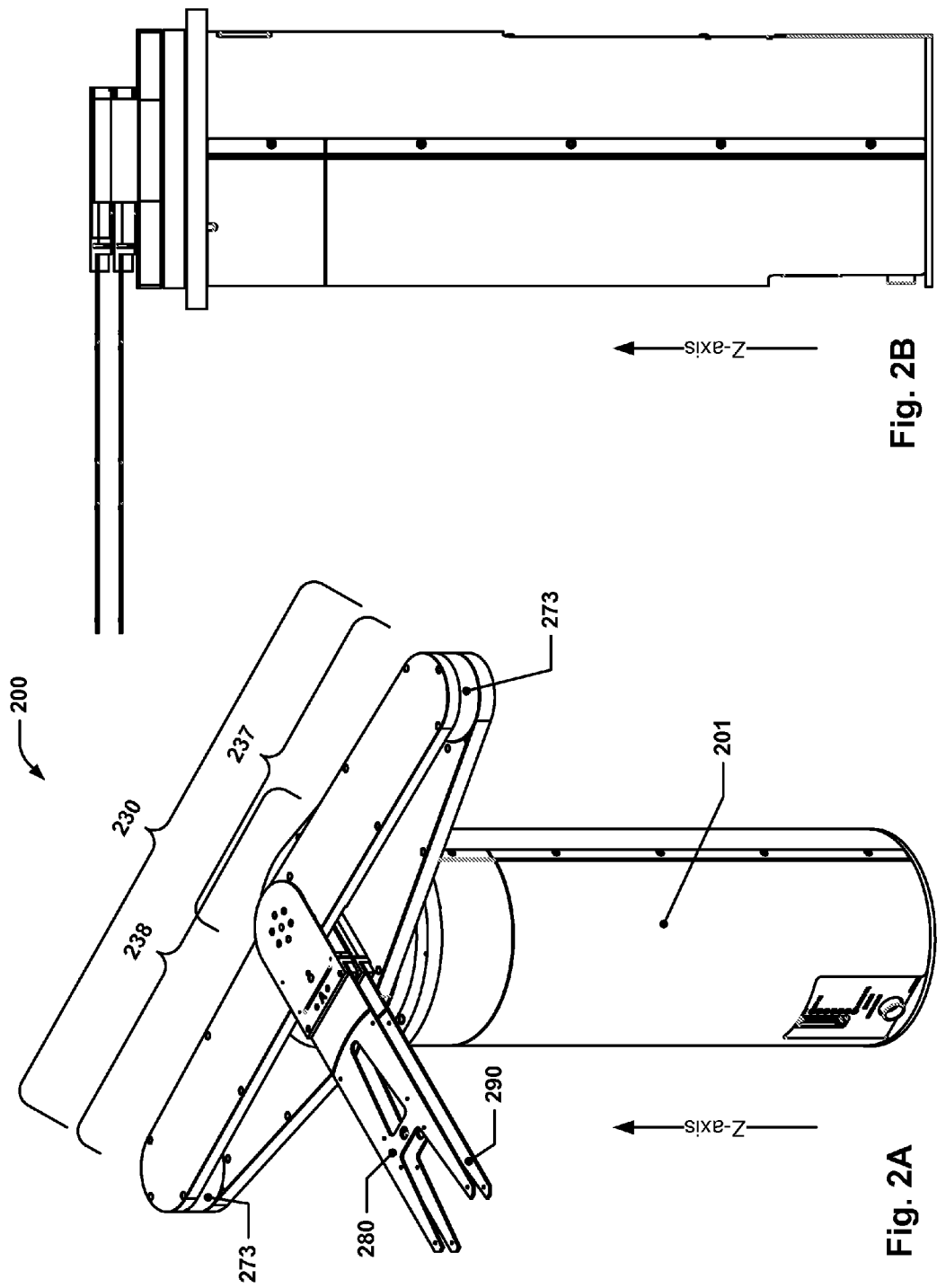
FIG. 2A shows an isometric view of another implementation of a robot according to the present disclosure.
FIG. 2B shows a side view of the robot of FIG. 2A.

As mentioned previously, other implementations may feature an arm assembly with end effectors facing the same direction. FIG. 2A shows an isometric view of robot 200, which features an arm assembly 230 that is mounted to a base unit 201. The arm assembly 230 has an end effector A 280 and an end effector B 290 facing the same direction. FIG. 2B depicts a side view of the robot 200, and illustrates how the two end effectors are positioned in similar locations yet offset from one another.

In principle, the robot 200 may be constructed and operate in a very similar manner to the robot 100 discussed above. However, while largely similar in operation and construction, some differences may be observed. For example, whereas the drive motor A 107 and the drive motor B 108 may each be rotated in the same direction to translate the end effector A 180 and the end effector B 190, respectively, in the same radial direction in the robot 100, corresponding drive motors for each arm in the robot 200 may be rotated in opposite directions to cause the end effector A 280 and the end effector B 290 to translate in the same radial direction. To rotate the arm assembly 230 without translation of the end effector A 280 and the end effector B 290 away from the center of rotation, all three drive motors may be driven in the same direction.

Figure 2C:
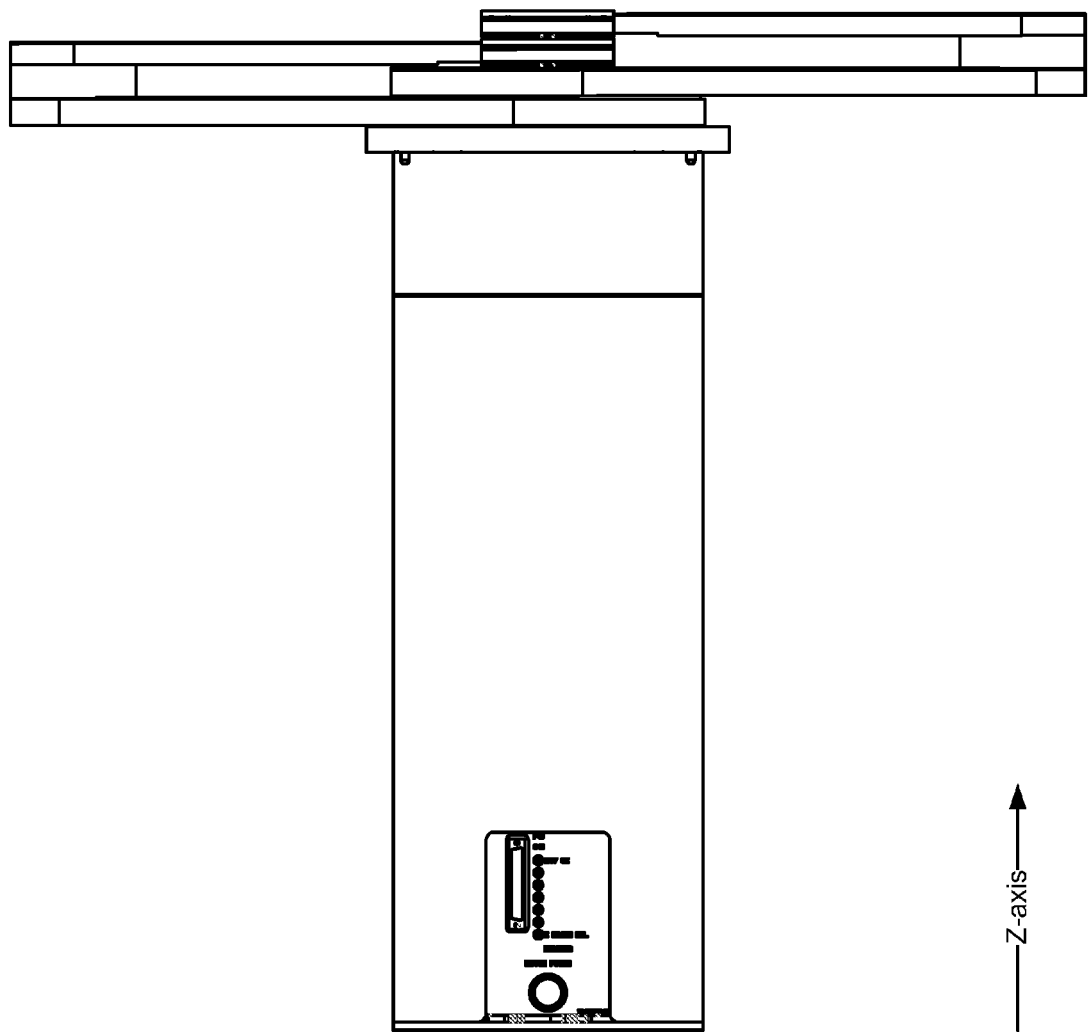
FIG. 2C shows a front view of the robot of FIG. 2A.
Figure 2D:
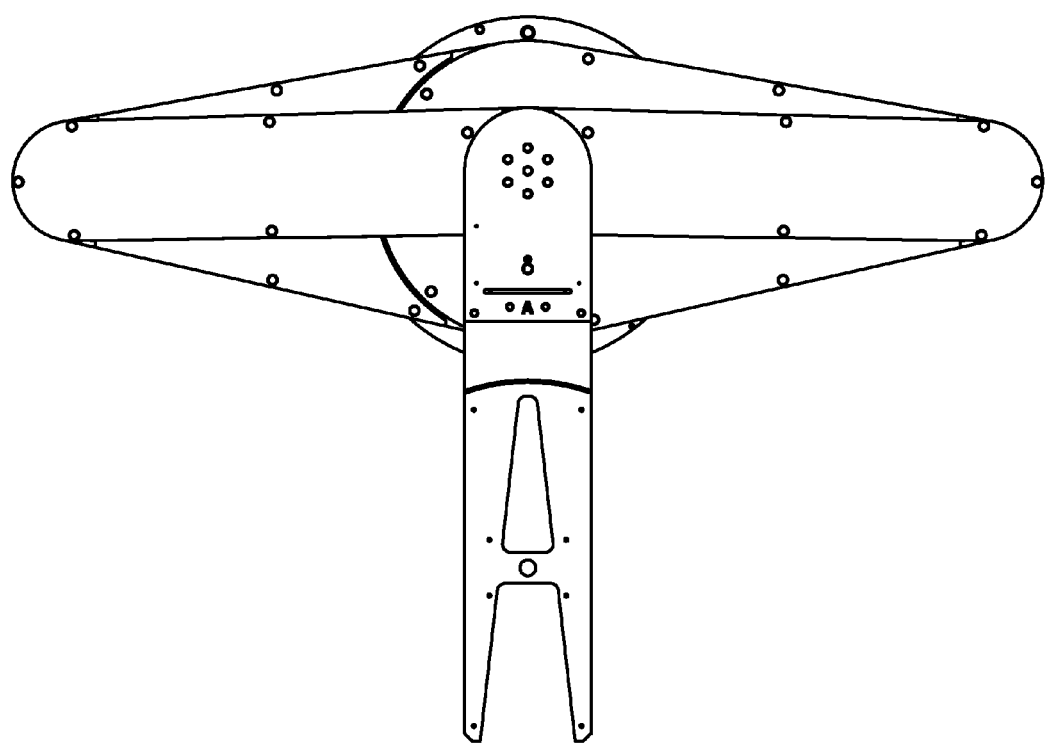
FIG. 2D shows a top view of the robot of FIG. 2A.

Another difference between the robot 200 and the robot 100 is that both the A arm 237 and the B arm 238 may feature spacers 273 which are similar to spacer 173 for B arm 138 in the robot 100. This extra spacer allows the A arm 237 and the B arm 238 to interleave with each other, as is evident in FIG. 2C. FIG. 2D shows a top view of the robot 200. Due to the end effectors both being in the same rest position but offset from each other, only the end effector A 280, and not the end effector B 290, is visible.

While the various internal mechanisms of robot 200 are not shown in the figures; they may be largely similar to the internal mechanisms of the robot 100.

Figure 3:
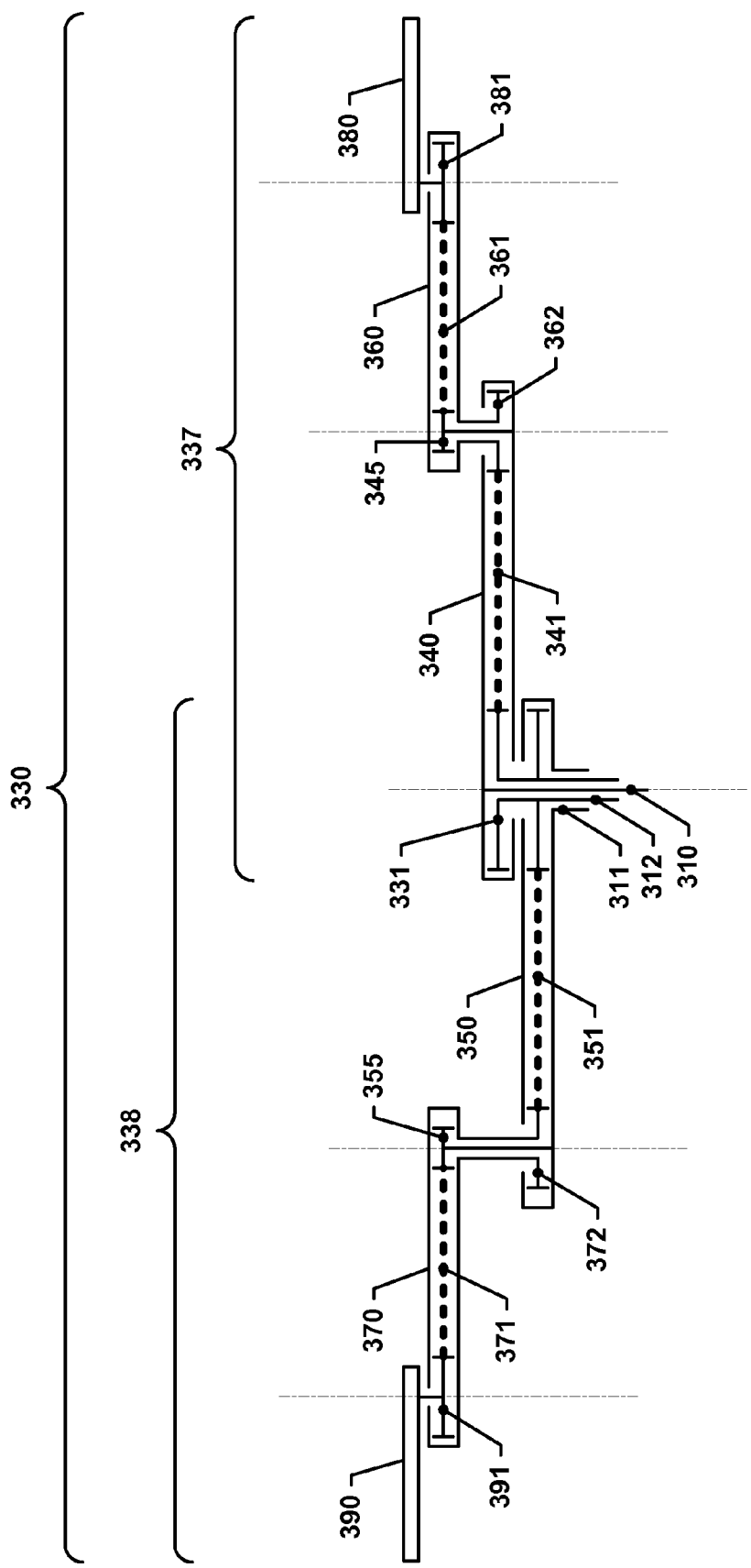
FIG. 3 shows a schematic of a dual-arm vacuum robot according to the present disclosure.

FIG. 3 shows a schematic of a dual-arm vacuum robot according to the present disclosure. Visible in FIG. 3 is an arm assembly 330 that includes an A arm 337 and a B arm 338. The A arm 337 includes an upper A arm 340, a lower A arm 360, and an end effector A 380. The B arm 338 includes an upper B arm 350, a lower B arm 370, and an end effector B 390. The upper A arm 340 is rigidly connected with an A drive shaft 310 and the upper B arm 350 is rigidly connected with a B drive shaft 311. A common drive shaft 312 may be coaxially interposed between the A drive shaft 310 and the B drive shaft 311 and may be rigidly connected with a common drive pulley assembly 331. Thus, the upper A arm 340 may be rotated by rotating the A drive shaft 310, the upper B arm 350 may be rotated by rotating the B drive shaft 311, and the common drive pulley assembly 331 may be rotated by rotating the common drive shaft 312.

The upper A arm 340 and the upper B arm 350 may both be configured to rotate about a substantially common axis; the ends of the upper A arm 340 and the upper B arm 350 that rotate about the substantially common axis may be referred to as proximal ends of the upper A arm 340 and the upper B arm 350, whereas the opposing ends of the upper A arm 340 and the upper B arm 350 may be referred to as distal ends of the upper A arm 340 and the upper B arm 350.

The upper A arm 340 may be rotatably connected with the lower A arm 360 at the distal end of the upper A arm 340. A lower A arm driven pulley 362 that is rigidly connected with the lower A arm 360 may protrude into the upper A arm 340, and an upper A arm drive pulley 345 that is rigidly connected with the upper A arm 340 may protrude into the lower A arm 360. An upper A arm drive belt 341 may rotatably connect the lower A arm driven pulley 362 with the common drive pulley assembly 331 such that relative rotation between the common drive pulley assembly 331 and the upper A arm 340 causes the lower A arm driven pulley 362, as well as the lower A arm 360, to rotate relative to the upper A arm 340. Similarly, the lower A arm 360 may be rotatably connected with the end effector A 380. An end effector A driven pulley 381 may be rigidly connected with the end effector A 380 and may protrude into the lower A arm 360. A lower A arm drive belt 361 may rotatably connect the upper A arm drive pulley 345 with the end effector A driven pulley 381 such that relative rotation between the upper A arm drive pulley 345 and the lower A arm 360 causes the end effector A driven pulley 381, as well as the end effector A 380, to rotate relative to the lower A arm 360.

The portion of the lower A arm 360 that is rotatably connected with the distal end of the upper A arm 340 may be referred to as the proximal end of the lower A arm 360, and the opposing end of the lower A arm 360, i.e., the end that is rotatably connected with the end effector A 380, may be referred to as the distal end of the lower A arm 360.

In a similar fashion, the upper B arm 350 may be rotatably connected with the lower B arm 370 at the distal end of the upper B arm 350. A lower B arm driven pulley 372 that is rigidly connected with the lower B arm 370 may protrude into the upper B arm 350, and an upper B arm drive pulley 355 that is rigidly connected with the upper B arm 350 may protrude into the lower B arm 370. An upper B arm drive belt 351 may rotatably connect the lower B arm driven pulley 372 with the common drive pulley assembly 331 such that relative rotation between the common drive pulley assembly 331 and the upper B arm 350 causes the lower B arm driven pulley 372, as well as the lower B arm 370, to rotate relative to the upper B arm 350. Similarly, the lower B arm 370 may be rotatably connected with the end effector B 390. An end effector B driven pulley 391 may be rigidly connected with the end effector B 390 and may protrude into the lower B arm 370. A lower B arm drive belt 371 may rotatably connect the upper B arm drive pulley 355 with the end effector B driven pulley 391 such that relative rotation between the upper B arm drive pulley 355 and the lower B arm 370 causes the end effector B driven pulley 391, as well as the end effector B 390, to rotate relative to the lower B arm 370.

Similarly, the portion of the lower B arm 370 that is rotatably connected with the distal end of the upper B arm 350 may be referred to as the proximal end of the lower B arm 370, and the opposing end of the lower B arm 370, i.e., the end that is rotatably connected with the end effector B 390, may be referred to as the distal end of the lower B arm 370.

Thus, rotating the A drive shaft 310 without rotating the common drive shaft 312 or the B drive shaft 311 may cause the A arm 337 to extend or retract without extending or retracting the B arm 338 and without rotating either the A arm 337 or the B arm 338. Similarly, rotating the B drive shaft 311 without rotating the common drive shaft 312 or the A drive shaft 310 may cause the B arm 338 to extend or retract without extending or retracting the A arm 337 and without rotating either the A arm 337 or the B arm 338. Rotating the A drive shaft 310, the B drive shaft 311, and the common drive shaft 312 may cause the A arm 337 and the B arm 338 to rotate about the center of the arm assembly 330 without extending or retracting.

The ratio of the common drive pulley assembly 331 diameter to either the lower A arm driven pulley 362 diameter or the lower B arm driven pulley 372 diameter may be 2:1; this may cause twice as much relative rotation between the lower A arm driven pulley 362 and the upper A arm 340 as between the common drive pulley assembly 331 and the upper A arm 340. Similarly, the ratio of the end effector A driven pulley 381 diameter or the end effector B driven pulley 391 diameter to the upper A arm drive pulley 345 or the upper B arm drive pulley 355, respectively, may be 2:1; this may, for example, cause half as much relative rotation between the end effector A 380 and the lower A arm 360 as between the upper A arm drive pulley 345 and the lower A arm 360.

Such arrangements allow for independent retraction and extension of either robot arm, as well as rotation of the robot arms together, with a lower number of motors as compared to two-arm systems that allow for both arms to extend, retract, and rotate with complete independence. Coupling rotational movement of the robot arms also allows for a simpler control scheme, since it is unnecessary to monitor the positions of the arms with respect to each other to prevent rotational interference with one another.

Figure 4A:
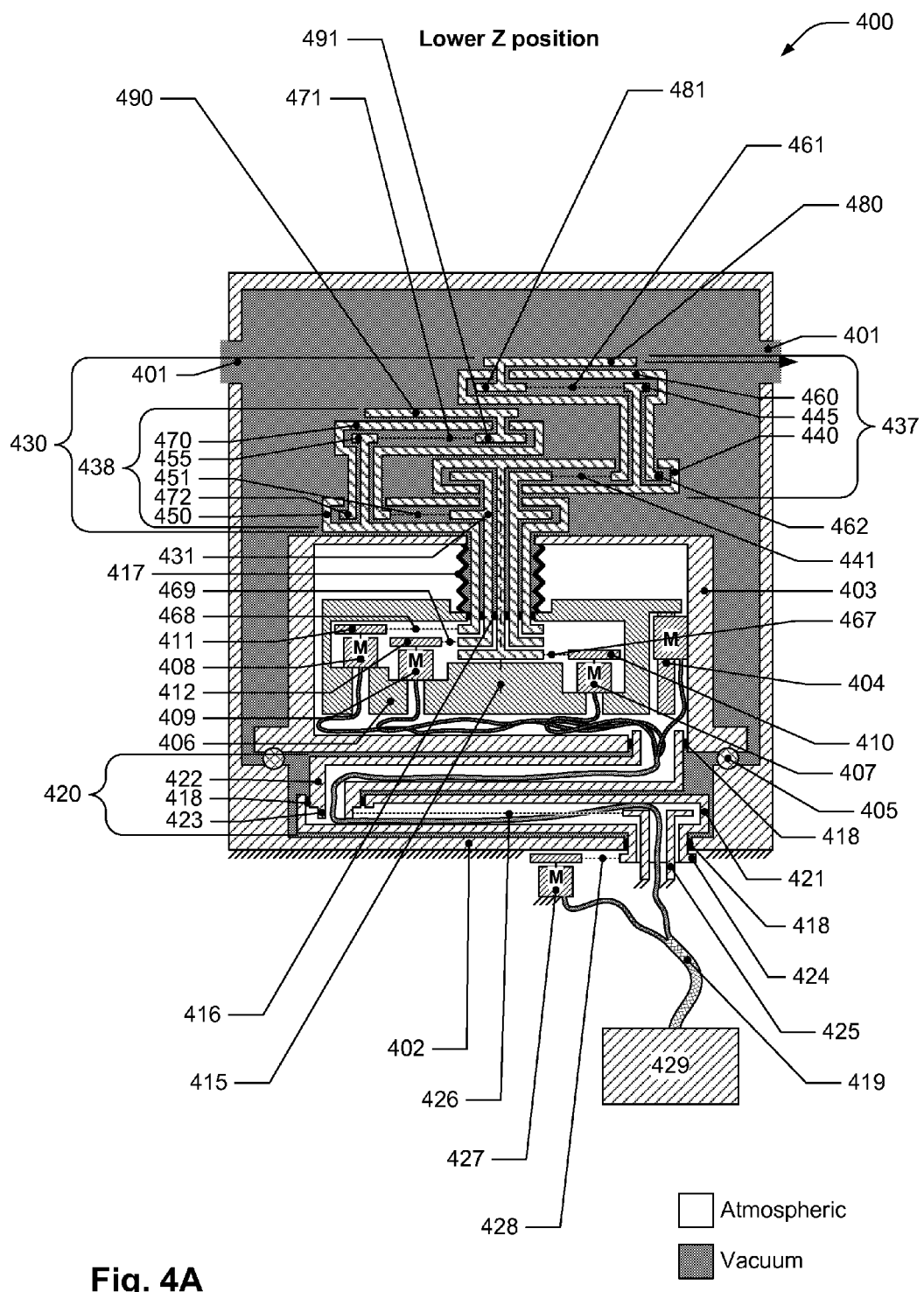
FIG. 4A shows a schematic of a dual-arm vacuum robot supported by a carriage housing configured for linear translation within a transfer chamber.

FIG. 4A shows a schematic of a dual-arm vacuum robot supported by a carriage housing configured for linear translation within a transfer chamber. A robot 400 is shown in FIG. 4A. The robot 400 may include a robot arm assembly 430 and a carriage housing 403. The carriage housing 403 may support the robot arm assembly 430 within a transfer chamber housing 402. The transfer chamber housing 402 may be substantially longer in one dimension than in the two orthogonal dimensions, and may include rails 405 (or other features that provide for linear translation) that are substantially parallel to the long axis of the transfer chamber housing. The carriage housing 403 may be configured to be supported by the rails 405 within the transfer chamber housing 402 and to translate along the rails 405 within the transfer chamber housing 402. The transfer chamber housing 402 may have a plurality of openings 401 spaced about the perimeter of the transfer chamber housing that may be configured to be connected to process chambers, loadlocks, or other subassemblies of a semiconductor process tool. The openings 401 may be sized to allow semiconductor wafers and portions of the robot arm assembly 430 to be passed through the openings 401 to facilitate wafer transfer and load/unload operations.

The robot arm assembly 430 that is shown features two arms, an A arm (shown primarily on the right in FIG. 4A) and a B arm (shown primarily on the left in FIG. 4A) and is similar to that discussed earlier in this disclosure. In the particular implementation shown in FIG. 4A, the A arm and the B arm may be rotated in tandem around a center axis of the robot arm assembly 430, e.g., about an axis 415 centered on, for example, common drive pulley assembly 431 and may each be independently extended and retracted in a direction generally parallel to a line passing through and perpendicular to the axis 415.

The A arm may include an upper A arm 440, a lower A arm 460, and an end effector A 480. The B arm may include an upper B arm 450, a lower B arm 470, and an end effector B 490. The upper A arm 440 may be connected, via an A drive belt 467 engaged with an A drive pulley 410, with an A drive motor 407. Similarly, the upper B arm 450 may be connected, via a B drive belt 468 engaged with a B drive pulley 411, with a B drive motor 408. A common drive pulley assembly 431 may be similarly driven by a common drive motor 409 via a common drive belt 469 engaged with a common drive pulley 412. The common pulley assembly 431 may be coaxially interposed between portions of the upper A arm 440 and the upper B arm 450. Thus, the upper A arm 440 may be rotated by rotating the A drive pulley 410, the upper B arm 450 may be rotated by rotating the B drive pulley 411, and the common drive pulley assembly 431 may be rotated by rotating the common drive pulley 412.

The upper A arm 440 and the upper B arm 450 may both be configured to rotate about a substantially common axis, e.g., the center axis 415; the ends of the upper A arm 440 and the upper B arm 450 about which the upper A arm 440 and the upper B arm 45° rotate may be referred to as proximal ends of the A arm 440 and the B arm 450, whereas the opposing ends of the A arm 440 and the B arm 450 may be referred to as distal ends of the A arm 440 and the B arm 450.

The upper A arm 440 may be rotatably connected with the lower A arm 460 at the distal end of the upper A arm 440. A lower A arm driven pulley 462 that is rigidly connected with the lower A arm 460 may protrude into the upper A arm 440, and an upper A arm drive pulley 445 that is rigidly connected with the upper A arm 440 may protrude into the lower A arm 460. An upper A arm drive belt 441 may rotatably connect the lower A arm driven pulley 462 with the common drive pulley assembly 431 such that relative rotation between the common drive pulley assembly 431 and the upper A arm 440 causes the lower A arm driven pulley 462, as well as the lower A arm 460, to rotate relative to the upper A arm 440. Similarly, the lower A arm 460 may be rotatably connected with the end effector A 480. An end effector A driven pulley 481 may be rigidly connected with the end effector A 480 and may protrude into the lower A arm 460. A lower A arm drive belt 461 may rotatably connect the upper A arm drive pulley 445 with the end effector A driven pulley 481 such that relative rotation between the upper A arm drive pulley 445 and the lower A arm 460 causes the end effector A driven pulley 481, as well as the end effector A 480, to rotate relative to the lower A arm 460.

The portion of the lower A arm 460 that is rotatably connected with the distal end of the upper A arm 440 may be referred to as the proximal end of the lower A arm 460, and the opposing end of the lower A arm 460, i.e., the end that is rotatably connected with the end effector A 480, may be referred to as the distal end of the lower A arm 460.

In a similar fashion, the upper B arm 450 may be rotatably connected with the lower B arm 470 at the distal end of the upper B arm 450. A lower B arm driven pulley 472 that is rigidly connected with the lower B arm 470 may protrude into the upper B arm 450, and an upper B arm drive pulley 455 that is rigidly connected with the upper B arm 450 may protrude into the lower B arm 470. An upper B arm drive belt 451 may rotatably connect the lower B arm driven pulley 472 with the common drive pulley assembly 431 such that relative rotation between the common drive pulley assembly 431 and the upper B arm 450 causes the lower B arm driven pulley 472, as well as the lower B arm 470, to rotate relative to the upper B arm 450. Similarly, the lower B arm 470 may be rotatably connected with the end effector B 490. An end effector B driven pulley 491 may be rigidly connected with the end effector B 490 and may protrude into the lower B arm 470. A lower B arm drive belt 471 may rotatably connect the upper B arm drive pulley 455 with the end effector B driven pulley 491 such that relative rotation between the upper B arm drive pulley 455 and the lower B arm 470 causes the end effector B driven pulley 491, as well as the end effector B 490, to rotate relative to the lower B arm 470.

Similarly, the portion of the lower B arm 470 that is rotatably connected with the distal end of the upper B arm 450 may be referred to as the proximal end of the lower B arm 470, and the opposing end of the lower B arm 470, i.e., the end that is rotatably connected with the end effector B 490, may be referred to as the distal end of the lower B arm 470.

Thus, rotating the A drive pulley 410 without rotating the common drive pulley 412 or the B drive pulley 411 may cause the A arm to extend or retract without extending or retracting the B arm and without rotating either the A arm or the B arm. Similarly, rotating the B drive pulley 411 without rotating the common drive pulley 412 or the A drive pulley 410 may cause the B arm to extend or retract without extending or retracting the A arm and without rotating either the A arm or the B arm. Rotating the A drive pulley 410, the B drive pulley 411, and the common drive pulley 412 may cause the A arm and the B arm to rotate about the center of the arm assembly 430 without extending or retracting.

The ratio of the common drive pulley assembly 431 diameter to either the lower A arm driven pulley 462 diameter or the lower B arm driven pulley 472 diameter may be 2:1; this may cause twice as much relative rotation between the lower A arm driven pulley 462 and the upper A arm 440 as between the common drive pulley assembly 431 and the upper A arm 440. Similarly, the ratio of the end effector A driven pulley 481 diameter or the end effector B driven pulley 491 diameter to the upper A arm drive pulley 445 or the upper B arm drive pulley 455, respectively, may be 2:1; this may, for example, cause half as much relative rotation between the end effector A 480 and the lower A arm 460 as between the upper A arm drive pulley 445 and the lower A arm 460.

The various rotatable connections between the upper arms, lower arms, and end effectors described above may be accomplished using non-vacuum tight rotatable interfaces, e.g., bearings that allow for pressure differentials across the bearings to equalize. Thus, the A arm 437 and the B arm 438 may be substantially free to equalize with the surrounding environment within the transfer chamber housing 402, i.e., under vacuum conditions, the A arm 437 and the B arm 438 may also be at vacuum. In some implementations, however, these rotatable interfaces may be provided by sealed bearing units, i.e., the interior of the upper arms, lower arms, and end effectors described above may be accomplished using vacuum-tight rotatable interfaces.

The arm assembly 430 may, as noted above, be supported by the carriage housing 403. In the implementation shown, the arm assembly 430 is capable of z-axis movement, i.e., the A arm 437 and the B arm 438 may move vertically to allow for the A and B end effectors 480/490 to move up and down. To facilitate such vertical movement, the carriage housing 403 may include a motor support 406, which may support the A drive motor 407, the B drive motor 408, and the common drive motor 409. The motor support 406 may also support the upper A arm 440, the upper B arm 450, and the common drive pulley assembly 431 via a triaxial ferro-fluid seal 416 (or other type of seal configured to allow for independent relative rotational movement between the upper A arm 440, the upper B arm 450, and the common drive pulley assembly 431 while substantially preventing gas leakage across the rotational interface). The motor support 406 may be connected with the carriage housing with a bellows coupling 417 that, in concert with the triaxial ferro-fluid seal 416, prevents leakage of gas through the interface between the upper A arm 440, the upper B arm 450, and the common drive pulley assembly 431 and the carriage housing 403. The bellows coupling 417 may flex to accommodate relative displacement between the carriage housing 403 and the motor support 406.

The motor support 406 may be raised and lowered within the carriage housing 403 through the use of a z-drive 404, e.g., a linear actuator configured to move the motor support 406 vertically with respect to the carriage housing 403.

As mentioned previously, the carriage housing 403 may be translated along the rails 405 to move the arm assembly 430 along the long axis of the transfer chamber housing 402. This translation may be driven using an umbilical arm 420 that also serves as a pressurized conduit housing cabling 419. The cabling 419 may be electrically connected to various components supported by the carriage housing 403, e.g., the A drive motor 407, the B drive motor 408, the common drive motor 409, the z-drive 404, etc.

The umbilical arm 420 may include an upper umbilical arm 421 and a lower umbilical arm 422. The upper umbilical arm 421 may be connected with the transfer chamber housing 402 via a rotational joint configured to rotate about an axis intersecting a point located approximately midway along the linear travel range of the carriage assembly 403, e.g., midway along the rails 405, and in close proximity to one of the long interior sides of the transfer chamber housing. This positioning may allow the upper umbilical arm 421 to be nearly as long as the interior of the transfer chamber housing 402 is wide and may allow the upper umbilical arm 421 to swing through a near-semicircular or semicircular arc within the transfer chamber housing 402. The end of the upper umbilical arm 421 intersecting the axis of rotation of the upper umbilical arm 421 may be referred to as the proximal end of the upper umbilical arm 421, and the opposite end of the upper umbilical arm 421 may be referred to as the distal end.

A proximal end of the lower umbilical arm 422 may be connected with the distal end of the upper umbilical arm 421 by a rotational joint. A distal end of the lower umbilical arm 422 opposite the proximal end of the lower umbilical arm 422 may, in turn, be connected with the carriage housing 403 via a further rotational joint. The distal end of the lower umbilical arm 422 may include a lower umbilical arm driven pulley 423 that extends into the upper umbilical arm 421 and that is connected via an upper umbilical arm drive belt 426 with a umbilical arm fixed pulley 425 that is centered on the rotational joint of the proximal end of the upper umbilical arm 421. The proximal end of the upper umbilical arm 421 may protrude through the transfer chamber housing 402 to provide an upper umbilical arm driven pulley 424 that may be driven by an umbilical arm drive motor 427 via an umbilical arm drive belt 428.

Each of the rotational joints joining the umbilical upper arm 421 with the transfer chamber housing 402, the upper umbilical arm 421 to the umbilical lower arm 422, and the umbilical lower arm 422 to the carriage housing 403 may include seals 418, e.g., ferro-fluid seals. Because of the seals 418 (and the triaxial ferro-fluid seal 416 and the bellows coupling 417), the volume within the umbilical arm 420 and the carriage housing 403 may be substantially sealed off from the remaining internal volume of the transfer chamber housing 402. This allows the interior volume of the transfer chamber housing 402 to be kept at vacuum conditions while the interior volume of the umbilical arm 420 and the carriage housing 402 may be kept at atmospheric conditions. This allows the use of motors that are not vacuum-rated to be used in the robot 400, e.g., such as the A drive motor 407, the B drive motor 408, the common drive motor 409, and the z-drive 404.

Electric motors often primarily rely on conductive and convective heat transfer for cooling. In a vacuum environment, convective heat transfer is largely nonexistent, reducing the amount of heat that can be shed by an electric motor. This can cause the motor to overheat at loads that would ordinarily not produce overheating in ambient conditions. Such overheating issues may be addressed by operating the motors at much lower loads than they are designed for (thus reducing generated heat) or by compensating for the heat transfer loss by implementing additional cooling measures, e.g., by actively cooling the motors with a liquid coolant. Each of these approaches introduces costs that may be undesirable. For example, operating the motors at a lower load level may cause overall transit times for the robot 400 to increase (thus reducing throughput in the semiconductor processing tool in which the robot 400 is used). In another example, using liquid cooling would require the use of coolant tubes, pumps, liquid seals, etc., all of which introduce significant cost and complexity into the design of the robot 400.

By housing all of the drive motors within a pressurized environment (pressurized with respect to the environment of the transfer chamber housing during normal semiconductor processing operations), the robot 400 avoids these issues and allows for the use of standard electric motors. Vacuum environment concerns are not an issue since the motors, including the umbilical arm drive motor 427, are isolated from the vacuum environment and operate in ambient atmospheric conditions. In some implementations, the pressure environment that the motors are held in may be less than ambient atmospheric conditions, e.g., approximately 0.5 atm or 0.75 atm. Generally speaking, the pressure that the motors may be operated in may be kept sufficiently high that overheating of the motors is not an issue.

The various drive motors of the robot 400 may be controlled by a controller 429. The controller 429 may also be connected to various sensor systems, e.g., position sensors, accelerometers, etc., that provide feedback regarding the robot 400 and that may the controller 429 to adjust motor control parameters to stay within process control limits, e.g., a maximum translational acceleration for the end effectors of the robot 400. The controller 429 may include one or more processors and a memory. The memory may store computer-executable instructions for controlling the one or more processors to control the motors.

Figure 4B:
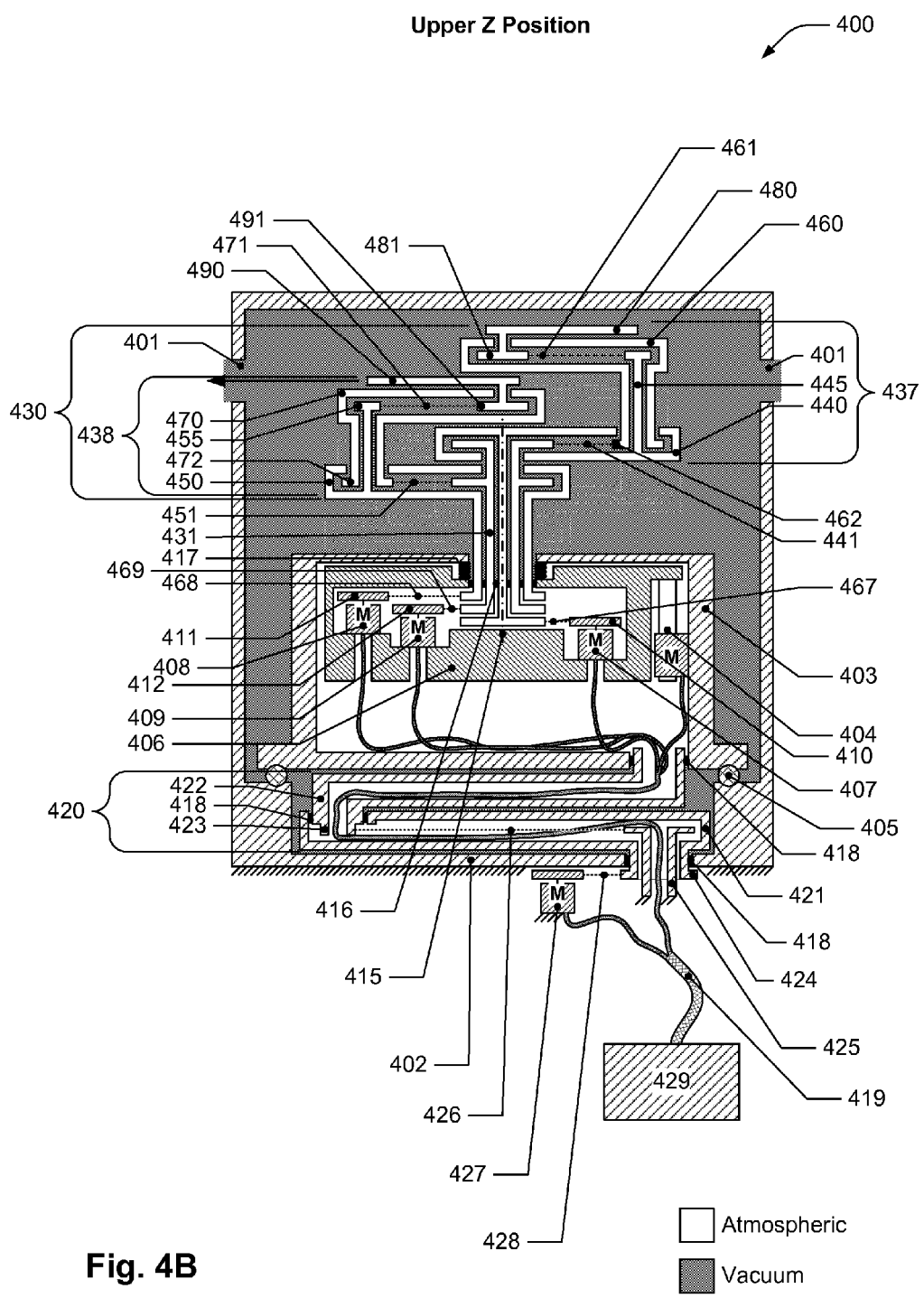
FIG. 4B shows a schematic of the dual-arm vacuum robot of FIG. 4A in a raised position.

FIG. 4B depicts a schematic of the robot 400 of FIG. 4A but with the arm assembly 430 in a raised position with respect to the carriage housing 403.

It is to be understood that FIGS. 4A and 4B depict the various portions of the arm assembly 430 positioned such that all of the rotational axes of the arm assembly 430 lie in the same plane, i.e., the plane of the drawing page. This, however, is merely a convention adopted to allow all of the various pulleys, belts, and other components to be easily seen. In actual practice, the rotational axes associated with the upper A arm 440/lower A arm 460 rotational connection and the upper B arm 450/lower B arm 470 rotational connection would generally not lie on the same plane as the rotational axes associated with other rotational connections in the arm assembly 430. This may be more clearly seen in FIGS. 5A through 5P.

For example, the arm assembly 430 may be very similar to the robot 100 shown in FIGS. 1A through 1J, although with some differences. For example, the robot 100 shown in FIGS. 1A through 1J features a cylindrical base unit 101 that is quite long in the axial direction as compared with its diameter; the drive motors in this configuration may be arranged in sequential fashion along or near the center axis due to fit within this packaging volume. In contrast, the motor arrangement driving the arm assembly 430 may instead be arrayed about the center axis of the arm assembly 430, i.e., the drive motors may be offset from the center axis of the arm assembly 430 (similar to the base unit 101 on the left side of FIG. 1C) and may overlap each other along the Z-axis so as to reduce the Z-axis thickness of the carriage housing 403.

It is also to be understood that various other types of robot arm assemblies may be used in place of the robot arm assembly 430. For example, robot arm assemblies similar to those described in U.S. Patent Application Publication 2012/0141235, which is hereby incorporated herein by reference in its entirety, may be used in place of the robot arm assembly 430 as needed. Such alternate arm assemblies may, for example, provide greater degrees of freedom, e.g., allow for independent rotation and extension of either robot arm, or may provide lesser degrees of freedom, e.g., simultaneous extension or retraction of both arms and simultaneous rotation of both arms. The drive motors for these alternate arm assemblies may, as in the above example, be housed within the sealed portion of the carriage housing 403 to isolate them from vacuum conditions within the transfer chamber housing 402. In such alternate implementations, the total numbers of motors used may differ depending on the degrees of freedom supported by the robot arm assemblies. Furthermore, depending on the particular configuration of the robot arm assembly used, different types of seals may need to be used, e.g., a single-axis or bi-axial ferrofluid seal may be used in some implementations, whereas other implementations may require a multiaxial ferrofluid seal capable of sealing more than 3 axles.

It is also be understood that other sealing technologies aside from ferrofluid seals may be used in some implementations. The concepts disclosed herein are not be limited to ferrofluid-only seals, but may be practiced as well with other types of seals.

Figure 5A:
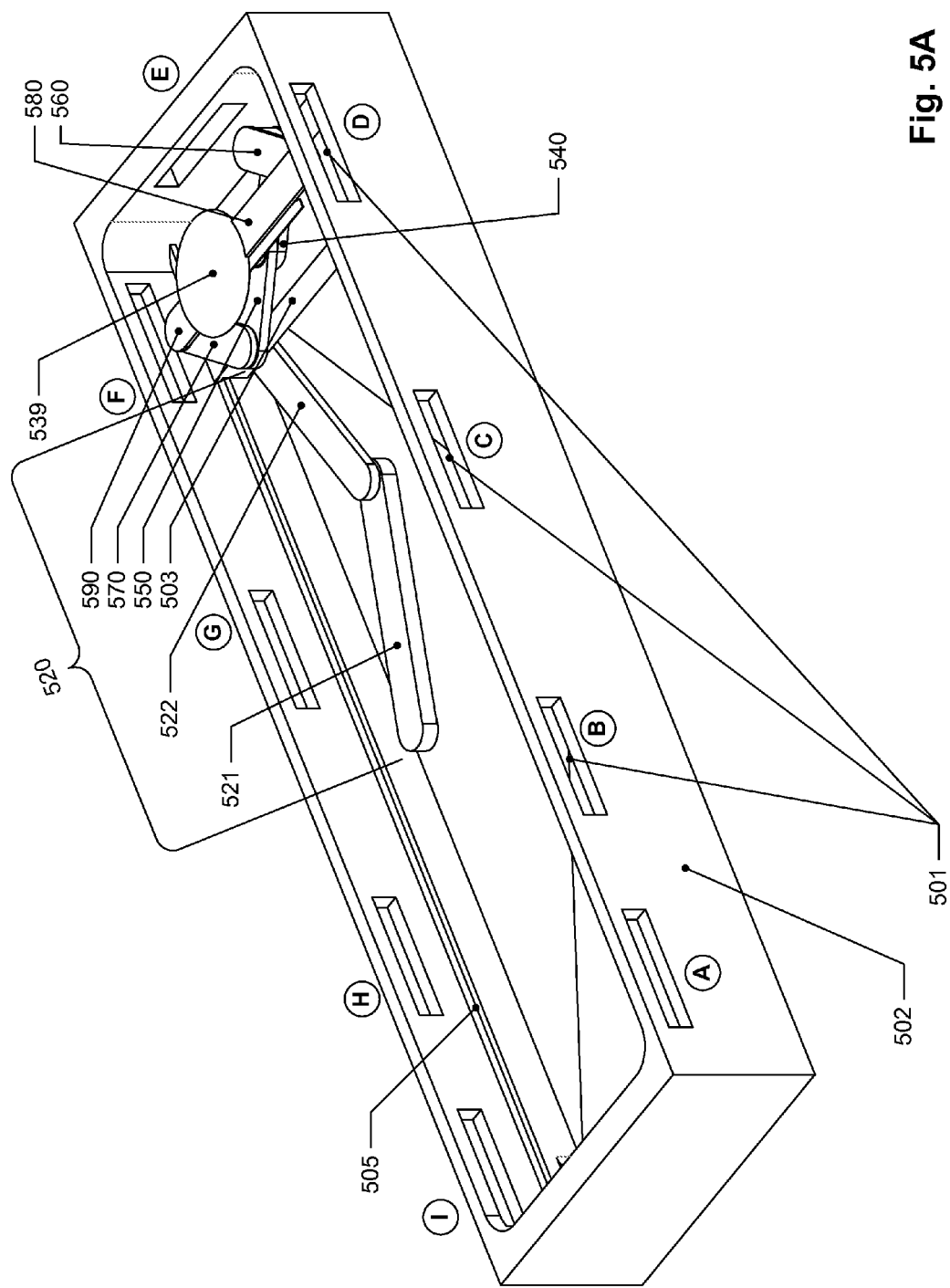
FIG. 5A shows an off-angle view of a transfer chamber equipped with a linear translation carriage and robot arm assembly.

FIG. 5A shows an off-angle view of a transfer chamber equipped with a linear translation carriage and robot arm assembly. As can be seen, transfer chamber housing 502 is substantially longer in one direction than in the two complementary orthogonal directions, e.g., at least 1.5 to 2 times longer (with respect to internal dimensions). These dimensions/aspect ratios are such that a fixed wafer transfer robot arm would not have the reach to be able to access all of the process chambers, wafer storage chambers, or other equipment that receives or supplies wafers that are attached to the transfer chamber. Four openings 501 are spaced along each of the two long sides of the transfer chamber housing 502, and a ninth opening 501 is located along one of the short sides spanning between the two long sides (each opening 501 is indicated by a different circled letter). Of course, other implementations may feature a larger or smaller number of openings 501, and the positioning of the openings 501 may differ from that shown. In actual practice, the transfer chamber housing 502 may be sealed with a cover (not shown) and process chambers, loadlocks, or other sealable environments (also not shown) may be connected with the openings 501.

Also visible in FIG. 5A is a rail 505 (a complementary rail 505 on the opposite side of the transfer chamber housing 502 is not visible in this view, but may be visible in other views). A carriage housing 503 may rest on the rails 505 in a manner that allows the carriage housing 503 to slide along the rails 505 and translate along the long axis of the transfer chamber housing. The rails may substantially restrict the motion of the carriage housing 503 to linear translation, i.e., the rails may prevent the carriage housing 503 from rotating with respect to the transfer chamber housing 502.

The carriage housing 503 may be caused to translate back and forth within the transfer chamber housing 502 through motion of the umbilical arm 520. The umbilical arm 520 may include an upper umbilical arm 521 and a lower umbilical arm 522. The upper umbilical arm 521 may be rotationally coupled to the transfer chamber housing 502 at a proximal end of the upper umbilical arm 521, and rotationally coupled to a proximal end of the lower umbilical arm 522 via another rotational coupling (sometimes referred to as the "elbow" of a two-link arm such as that shown). A distal end of the lower umbilical arm 522 may be rotatably connected with the carriage housing 503. A belt/pulley mechanism similar to that shown in FIGS. 4A and 4B may be used to cause the lower umbilical arm 522 to rotate in an opposite direction and with twice the rate of the upper umbilical arm 521. This may cause the distal end of the lower umbilical arm 522 to travel substantially along a path that is parallel to the rails 505. The umbilical arm 520 may have some compliance built into it, e.g., the belt used to rotate the lower umbilical arm 522 may be somewhat elastic in nature, to compensate for any slight misalignments between the linear path followed by the distal end of the lower umbilical arm 522 and the linear path provided by the rails 505.

Also visible in FIG. 5A is an arm assembly featuring an A arm and a B arm. The A arm includes an upper A arm 540, a lower A arm 560, and an end effector A 580, and the B arm includes an upper B arm 550, a lower B arm 570, and an end effector B 590. In FIG. 5A, the end effector A 580 supports a wafer 539.

FIGS. 5B through 5F show isometric views of the transfer chamber of FIG. 5A at various carriage translation and/or end effector positions. FIGS. 5G through 5K show corresponding off-angle views of the transfer chamber of FIG. 5A at various carriage translation and/or end effector positions. FIGS. 5L through 5P show corresponding perspective views of the transfer chamber of FIG. 5A at various carriage translation and/or end effector positions.

Figure 5B:
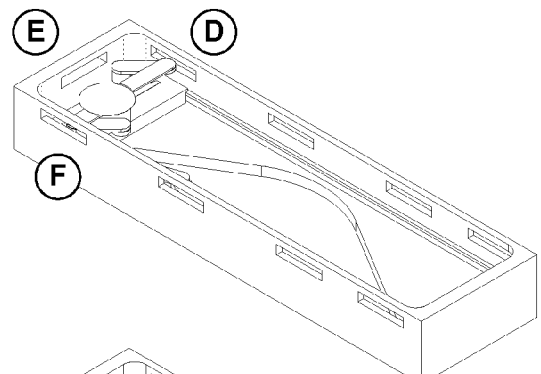
FIGS. 5B through 5F show isometric views of the transfer chamber of FIG. 5A at various carriage translation and/or end effector positions.
Figure 5C:
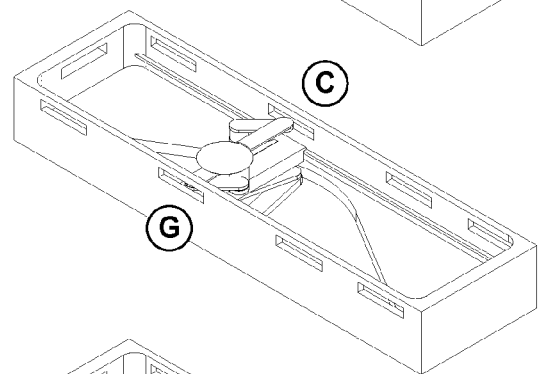
Figure 5D:
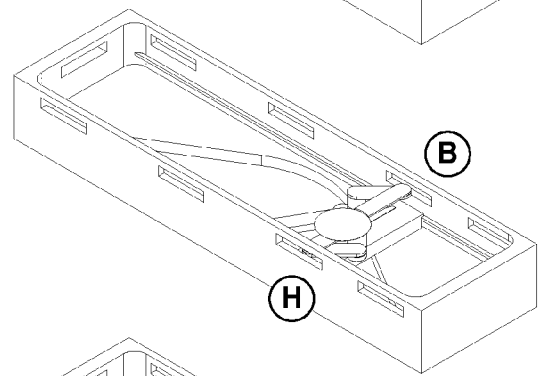
Figure 5E:
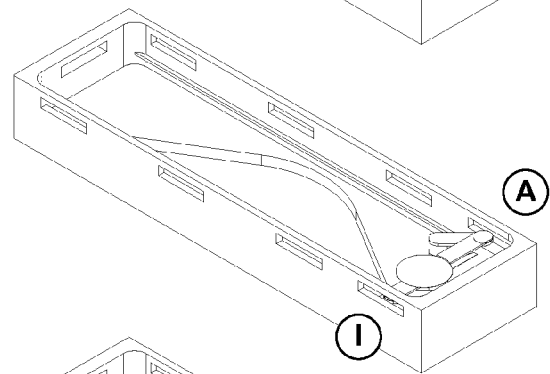
Figure 5F:
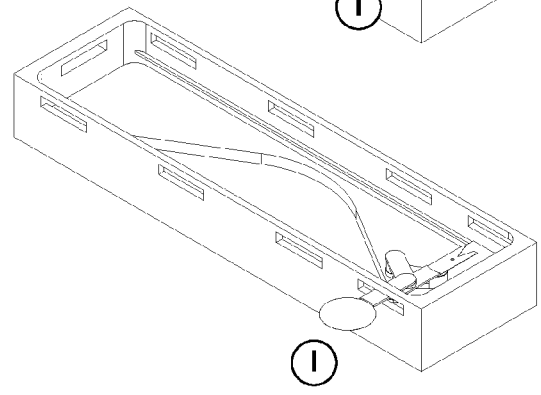
Figure 5G:
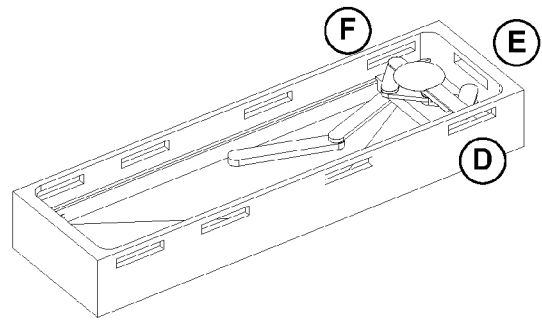
FIGS. 5G through 5K show off-angle views of the transfer chamber of FIG. 5A at various carriage translation and/or end effector positions.
Figure 5H:
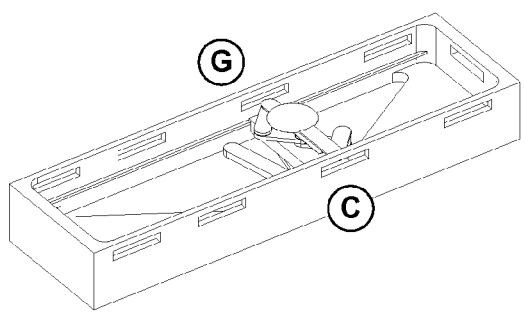
Figure 5I:
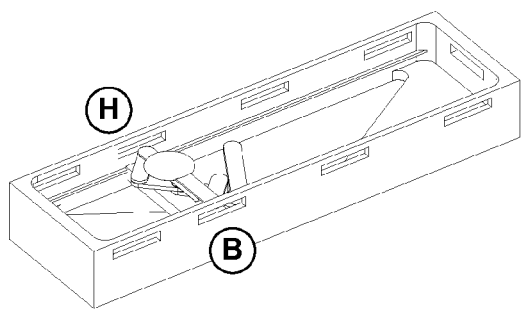
Figure 5J:
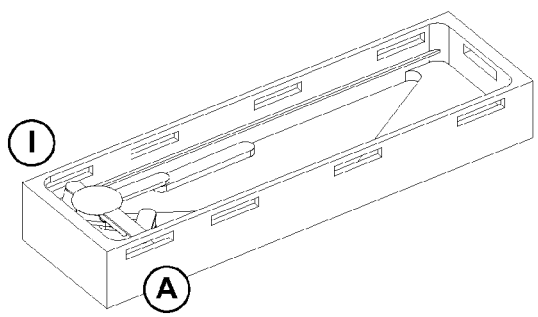
Figure 5K:
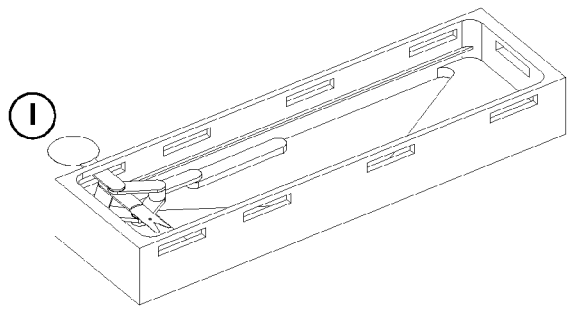
Figure 5L:
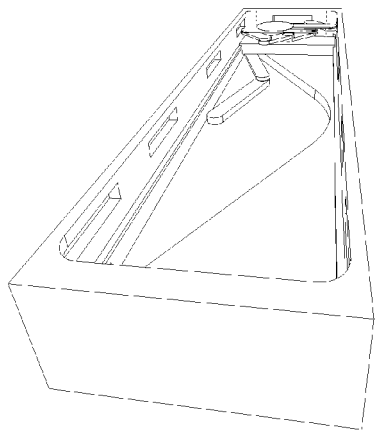
FIGS. 5L through 5P show perspective views of the transfer chamber of FIG. 5A at various carriage translation and/or end effector positions.

As can be seen in FIGS. 5B, 5G, and 5L, the carriage housing 503 is positioned near one end of the transfer chamber housing 502. From this position, the arm assembly may be used to place or retrieve a wafer 539 through either the opening 501 (F) or the opening 501 (D). The arm assembly may also be rotated in place to allow a wafer to be placed or retrieved through the opening 501 (E); the carriage housing 503 may be moved slightly towards the center of the transfer chamber housing 502 if needed to prevent collisions between the arm assembly and the transfer chamber housing 502 during rotation of the arm assembly.

Figure 5M:
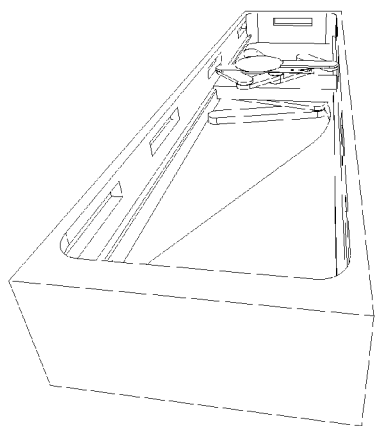

In FIGS. 5C, 5H, and 5M, the carriage housing 503 has been repositioned to facilitate wafer transfer through one or both of the openings 501 (G) and (C). This repositioning has been effected by causing the umbilical arm to rotate, thus dragging the carriage housing 503 towards the center of the transfer chamber housing 502.

Figure 5N:
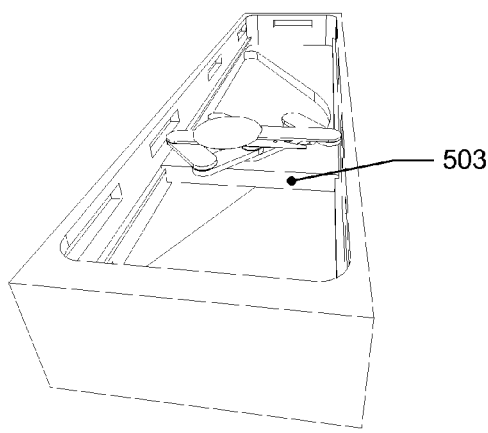

In FIGS. 5D, 5I, and 5N, the carriage housing 503 has been repositioned to facilitate wafer transfer through one or both of the openings 501 (H) and (B). This repositioning has been effected by causing the umbilical arm to rotate further, thus dragging the carriage housing 503 past the center of the transfer chamber housing 502 and towards the wall of the transfer chamber housing 502 without an opening 501.

Figure 5O:
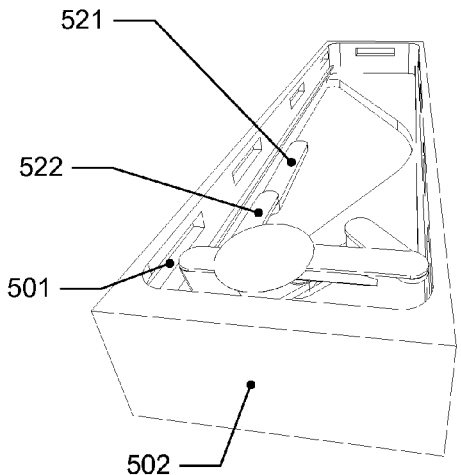

In FIGS. 5E, 5J, and 5O, the carriage housing 503 has been repositioned to facilitate wafer transfer through one or both of the openings 501 (I) and (A). This repositioning has been effected by causing the umbilical arm to rotate even further, thus dragging the carriage housing 503 to the opposite end of the transfer chamber housing 502.

Figure 5P:
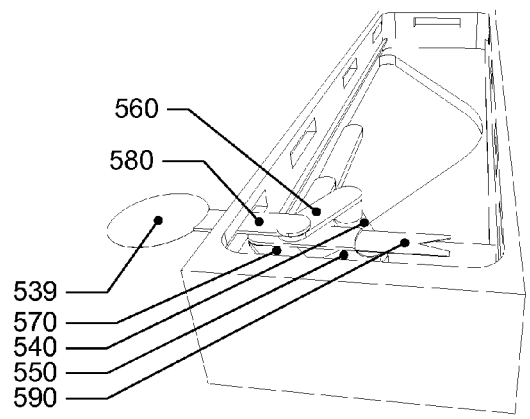

In FIGS. 5F, 5K, and 5P, the A arm has been extended through the opening 501 (I) and into a process chamber (not shown).

It is readily apparent from FIGS. 5A through 5P that a transfer chamber equipped as described herein may allow for a single robot arm assembly to transfer wafers between a large number of connected process chambers or other semiconductor handling apparatuses arranged in two or more substantially linear rows. Such a transfer chamber may feature electric motor drives that are all sealed off from the interior of the transfer chamber, allowing the transfer chamber to be kept at vacuum while the motor drives are kept at atmospheric or ambient conditions. Of course, some implementations may feature multiple carriage housings and arm assemblies arranged in series (perhaps sharing the same set of rails). Such implementations may be configured to pass wafers between the two arm assemblies to facilitate transfer between chambers.

In some implementations, the umbilical arm may include more than one elbow joint and may include additional arm segments between the upper and lower umbilical arms. For example, the umbilical arm may have three elbow joints and two additional arm segments (forming a "W" shape instead of a "V" shape when viewed along the rotation axis of one of the elbow joints). This may facilitate longer linear travel ranges of the carriage assembly for a transfer chamber housing of a given width perpendicular to the linear translation axis.

It is to be understood that the robots described above may also include a system controller having instructions for controlling the robot during process operations in accordance with the present invention. For example, the controller may be configured to translate a command to extend an end effector A into signals that activate drive motor A without activating drive motor B or the common drive motor. Similarly, the controller may be configured to translate a command to rotate the A arm and the B arm into drive signals that activate the A drive motor, the B drive motor, and the common drive motor in the same direction. The controller may also be configured to cause the umbilical arm to rotate, thus translating the carriage housing. The controller may be configured to translate other commands to the robot arm in a manner consistent with the above disclosure. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. A robot such as that described herein may be used to move a substrate from one tool to another, thus facilitating fabrication processes.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:
1. An apparatus comprising:
a transfer chamber housing that is substantially longer along a first translation axis than along a complementary horizontal axis;
a carriage housing configured to translate linearly along the first translation axis and within a linear translation range within the transfer chamber housing; and
an umbilical arm having at least one elbow joint, wherein:
a first end of the umbilical arm is rotatably connected with the transfer chamber housing so as to be rotatable about a first rotation axis with respect to the transfer chamber housing,
a second end of the umbilical arm opposite the first end is rotatably connected with the carriage housing so as to be rotatable about a second rotation axis with respect to the carriage housing,
the first end of the umbilical arm is connected with an umbilical arm drive motor configured to rotate the first end of the umbilical arm about the first rotation axis with respect to the transfer chamber housing, and
the apparatus is configured such that rotation of the first end of the umbilical arm about the first rotation axis with respect to the transfer chamber housing causes the second end of the umbilical arm, the carriage housing, and the second rotation axis to translate in a direction parallel to the first translation axis and the second end of the umbilical arm to rotate about the second rotation axis with respect to the carriage housing.

2. The apparatus of claim 1, wherein:
the transfer chamber housing has an interior volume that is configured to be sealable, and
the umbilical arm and the carriage housing have internal volumes that are sealed off from the interior volume of the transfer chamber housing.

3. The apparatus of claim 2, wherein the transfer chamber housing includes a plurality of ports along at least one side of the transfer chamber housing substantially parallel to the first translation axis, each port at least sized to permit a wafer to be inserted therethrough and each port configured to be hermetically connected to another component.

4. The apparatus of claim 3, wherein the transfer chamber housing includes four ports along each of two sides of the transfer chamber housing substantially parallel to the first translation axis and a ninth port in a side of the transfer chamber housing normal to the first translation axis.

5. The apparatus of claim 1, further comprising a cable assembly, wherein the cable assembly is routed from the first end of the umbilical arm, through the internal volume of the umbilical arm, and into the internal volume of the carriage housing via the second end of the umbilical arm.

6. The apparatus of claim 1, wherein at least one elbow joint of the umbilical arm includes a sealed bearing assembly.

7. The apparatus of claim 6, wherein the sealed bearing assembly is sealed by a ferrofluid seal.

8. The apparatus of claim 1, wherein the umbilical arm includes at least one drive belt mechanism configured to cause the second end of the umbilical arm to rotate about an elbow joint axis of the elbow joint closest to the second end of the umbilical arm in a first direction when the first end of the umbilical arm is rotated about the first rotation axis in an opposing second direction.

9. The apparatus of claim 8, wherein the at least one drive belt mechanism is configured to cause the second end of the umbilical arm to rotate about the elbow joint axis at twice the rate that the first end of the umbilical arm rotates about the first rotation axis.

10. The apparatus of claim 1, wherein the first rotation axis is positioned approximately midway along the linear translation range.

11. The apparatus of claim 1, wherein the first rotation axis and the second rotation axis are both parallel to one another and both generally intersect, and are generally perpendicular to, a reference line that is parallel to the first translation axis.

12. The apparatus of claim 1, further comprising a robot arm assembly having at least one robot arm with at least one end effector configured to support a wafer, wherein the robot arm assembly is configured to rotate about a third rotation axis substantially perpendicular to the first translation axis.

13. The apparatus of claim 12, wherein the robot arm assembly has at least two robot arms, each equipped with an end effector configured to support a wafer.

14. The apparatus of claim 12, further comprising:
a motor support located within the internal volume of the carriage housing, the motor support configured to translate along a second translation axis parallel to the third rotation axis and within the carriage housing, and
a linear drive system, the linear drive system configured to move the motor support along the second translation axis within the internal volume of the carriage housing, wherein the motor support supports the robot arm assembly.

15. The apparatus of claim 14, further comprising:
a first drive motor;
a second drive motor; and
a common drive motor, wherein:
the first drive motor, the second drive motor, and the common drive motor are all mounted to, and supported by, the motor support,
the at least one robot arm includes a first robot arm that has a first upper arm and a second lower arm,
the at least one robot arm includes a second robot arm that has a second upper arm and a second lower arm,
the first upper arm and the second upper arm are both configured to rotate about the third rotation axis,
first ends of the first upper arm and the second upper arm are proximate to the third rotation axis,
the first drive motor is configured to rotate the first upper arm about the third rotation axis,
the second drive motor is configured to rotate the second upper arm about the third rotation axis,
the common drive motor is configured to rotate a common pulley centered on the third rotation axis and connected with belt drive mechanisms within each robot arm,
a first end of the first lower arm is rotatably connected with a second end of the first upper arm opposite the first end of the first upper arm via a first arm elbow having a first arm elbow rotation axis,
a first end of the second lower arm is rotatably connected with a second end of the second upper arm opposite the first end of the second upper arm via a second arm elbow having a second arm elbow rotation axis,
the two robot arms, the first drive motor, the second drive motor, and the common drive motor are configured such that:
activating the first drive motor without activating the common drive motor causes the at least one end effector of the first robot arm to translate along a first substantially radial axis,
activating the second drive motor without activating the common drive motor causes the at least one end effector of the second robot arm to translate along a second substantially radial axis,
activating the first drive motor, the second drive motor, and the common drive motor such that the first upper arm, the second upper arm, and the common pulley all have the same rotational rate causes the first robot arm and the second robot arm to rotate about the third rotation axis without linear translation of the end effectors of the first robot arm and the second robot arm.

16. The apparatus of claim 14, further comprising at least two drive motors configured to drive the robot arm assembly, wherein:
a first drive motor of the at least two drive motors is configured to cause the end effector to extend and retract generally along a first radial direction when activated without activating a second drive motor of the at least two drive motors,
the second drive motor of the at least two drive motors is configured to cause the robot arm assembly to rotate about the third rotation axis when activated in tandem with the first drive motor, and
the first drive motor and the second drive motor are both mounted to, and supported by, the motor support.

17. The apparatus of claim 15, wherein:
the umbilical arm has an upper umbilical arm and a lower umbilical arm,
the upper umbilical arm has a first end corresponding to the first end of the umbilical arm and an opposing second end connected with a first elbow joint of the at least one elbow joint,
the lower umbilical arm has a first end connected with the first elbow joint and an opposing second end corresponding to the second end of the umbilical arm,
the lower umbilical arm and the upper umbilical arm are configured to rotate with respect to one another about an elbow axis of the first elbow joint, and
the elbow axis, the first rotation axis, and the second rotation axis are all parallel to one another.

18. The apparatus of claim 17, wherein a first perpendicular distance between the elbow axis and the first rotation axis is the same as a second perpendicular distance between the elbow axis and the second rotation axis.

19. A wafer handling robot apparatus comprising:
a carriage housing configured to translate linearly along a translation axis and within a linear translation range;
at least one robot arm mounted to the carriage housing; and
an umbilical arm having at least one elbow joint, wherein:
a first end of the umbilical arm is configured to rotate about a first rotation axis with respect to the translation axis,
the first rotation axis is fixed with respect to the linear translation range,
a second end of the umbilical arm opposite the first end is rotatably connected with the carriage housing so as to be rotatable about a second rotation axis with respect to the carriage housing,
the first end of the umbilical arm is connected with an umbilical arm drive motor configured to rotate the first end of the umbilical arm about the first rotation axis with respect to the translation axis, and
the wafer handling robot is configured such that rotation of the first end of the umbilical arm about the first rotation axis with respect to the translation axis by the umbilical arm drive motor causes the second end of the umbilical arm, the carriage housing, and the second rotation axis to translate in a direction parallel to the translation axis and the second end of the umbilical arm to rotate about the second rotation axis with respect to the carriage housing.

20. The wafer handling robot apparatus of claim 19, wherein the first rotation axis is located approximately midway along the linear translation range.

21. The wafer handling robot apparatus of claim 19, wherein internal volumes of the umbilical arm and the carriage housing up to the first end of the umbilical arm provide a sealed environment.

22. An apparatus comprising:
- a transfer chamber housing that is substantially longer along a first translation axis than along a complementary horizontal axis and that has an internal volume;
- a substrate transfer robot having at least one robot arm configured to handle a substrate and at least one drive motor configured to drive the at least one robot arm; and
- an umbilical arm configured to translate the substrate transfer robot, including the at least one robot arm and the at least one drive motor configured to drive the at least one robot arm, along a translation axis, wherein:
  - the substrate transfer robot is located within the internal volume of the transfer chamber housing, and
  - the apparatus is configured to maintain a pressure differential between the at least one drive motor and the internal volume of the transfer chamber housing during wafer processing operations.

23. The apparatus of claim 22, wherein the pressure differential is at least 0.5 atm.

\* \* \* \* \*